(12) United States Patent
Sullivan et al.

(10) Patent No.: US 12,557,240 B2
(45) Date of Patent: Feb. 17, 2026

(54) HEAT RECOVERY FROM MULTIPLE LAYERS OF COMPUTER COMPONENTS

(71) Applicant: MintGreen Blockchain Innovation Corp., Burnaby (CA)

(72) Inventors: Colin Patrick James Sullivan, Burnaby (CA); Alexandre David James Tardif, Burnaby (CA)

(73) Assignee: MintGreen Blockchain Innovation Corp., Burnaby (CA)

( * ) Notice: Subject to any disclaimer, the term of this patent is extended or adjusted under 35 U.S.C. 154(b) by 156 days.

(21) Appl. No.: 18/320,799

(22) Filed: May 19, 2023

(65) Prior Publication Data

US 2023/0380101 A1    Nov. 23, 2023

Related U.S. Application Data

(60) Provisional application No. 63/365,065, filed on May 20, 2022.

(51) Int. Cl.
*H05K 7/20* (2006.01)
*G06F 1/20* (2006.01)

(52) U.S. Cl.
CPC ........... *H05K 7/20236* (2013.01); *G06F 1/20* (2013.01); *H05K 7/20272* (2013.01); *H05K 7/20409* (2013.01)

(58) Field of Classification Search
CPC ........... H05K 7/20236; H05K 7/20272; H05K 7/20409; H05K 7/20781; H05K 7/203; G06F 1/20
See application file for complete search history.

(56) References Cited

U.S. PATENT DOCUMENTS

| | | | | |
|---|---|---|---|---|
| 5,787,976 A | * | 8/1998 | Hamburgen | H01L 23/3672 257/E23.09 |
| 6,009,938 A | * | 1/2000 | Smith | H01L 23/3672 257/722 |
| 8,867,204 B1 | * | 10/2014 | Gardner | H05K 7/1497 361/679.49 |
| 2004/0213651 A1 | * | 10/2004 | Malin | G01N 35/028 414/331.05 |
| 2009/0268405 A1 | * | 10/2009 | Kaveh | H05K 7/20918 361/697 |
| 2013/0108253 A1 | * | 5/2013 | Akers | H05K 7/20145 392/485 |
| 2022/0361381 A1 | * | 11/2022 | Sweeney | H05K 7/20781 |
| 2022/0369493 A1 | * | 11/2022 | Alissa | H05K 7/20818 |
| 2022/0400577 A1 | * | 12/2022 | Smith | H05K 7/20236 |

(Continued)

*Primary Examiner* — Stephen S Sul
(74) *Attorney, Agent, or Firm* — DLA Piper LLP (US)

(57) ABSTRACT

An example of an apparatus to recover heat from multiple layers of computer components is provided. The apparatus includes a tank to store a fluid. The apparatus further includes a first mining layer disposed in the tank. In addition, the apparatus includes a second mining layer disposed in the tank proximate to the first mining layer. The first mining layer and the second mining layer are substantially parallel. The apparatus also includes an outlet disposed on the tank to release the fluid. Furthermore, the apparatus includes a pump to generate a suction to draw the fluid out of the tank via the outlet. The suction creates a fluid flow in a space between the first mining layer and the second mining layer.

8 Claims, 22 Drawing Sheets

(56) References Cited

U.S. PATENT DOCUMENTS

| | | | |
|---|---|---|---|
| 2023/0025254 A1* | 1/2023 | Curtis | H05K 7/20254 |
| 2023/0164952 A1* | 5/2023 | Ortega Gutierrez | H05K 7/20318 361/699 |
| 2023/0363110 A1* | 11/2023 | Testa | H05K 7/20327 |

* cited by examiner

HEAT RECOVERY FROM MULTIPLE LAYERS OF COMPUTER COMPONENTS

CROSS-REFERENCE TO RELATED APPLICATIONS

This application claims priority to U.S. Provisional Application No. 63/365,065, filed May 20, 2022, which is herein incorporated by reference in its entirety.

BACKGROUND

Computers are used in many aspects of modern day life. In particular, computers are used to carry out instructions quickly and provide for the automation of many processes. One area in which computers have particularly excelled at is in the area of performing calculations based on mathematical formulas. In operation, computers use electricity to manipulate components to carry out the calculations. Due to inherent resistance in the conditioning incoming current and the delivery of electricity to various components of the computer system, heat is generated. For any process or calculation demanding a large amount of computational resources, a large amount of heat may be generated.

An example of a computer system that may generate a large amount of heat as a result of computer calculations is a system used for mining cryptocurrency. Cryptocurrency is a digital currency that is secured by cryptography through a process often referred to as mining. In use, an online ledger with cryptography secures online transactions of cryptocurrency between parties. Cryptocurrency mining is used for many cryptocurrencies to add security to the cryptocurrency network and process transactions. Cryptocurrencies as a technology can offer many increased efficiencies when compared to traditional financial systems, which has seen their use and proliferation increase over time. As cryptocurrencies become more widespread and cryptocurrency networks become larger, more computing power is used for mining to secure these networks and process transactions, producing heat energy as a waste product. Other examples of computer systems generating a large amount of heat may involve server systems used to model complex mathematical systems, such as classification models or simulation modelling.

BRIEF DESCRIPTION OF THE DRAWINGS

Reference will now be made, by way of example only, to the accompanying drawings in which.

DETAILED DESCRIPTION

Figure 1:
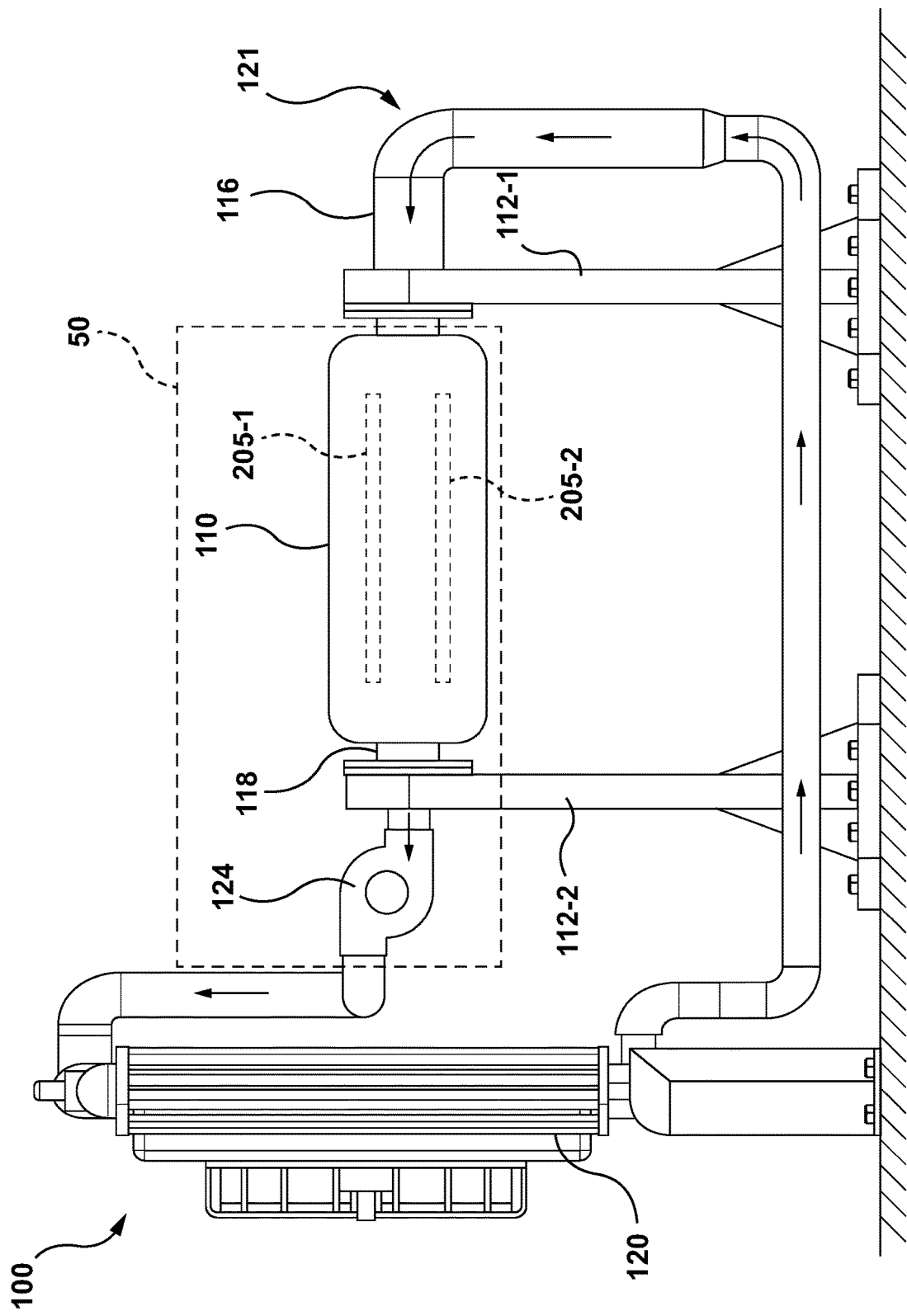
FIG. 1 is a view of an example of a system to recover heat from multiple layers of computer components.

Some examples of this disclosure, illustrating its features, will now be discussed in detail. The words "comprising", "having", "containing", and "including", and other forms thereof are intended to be equivalent in meaning and be open-ended in that an item or items following any one of these words is not meant to be an exhaustive listing of such item or items or meant to be limited to only the listed item or items.

It is also noted that as used herein and in the appended claims, the singular forms "a", "an", and "the" include plural references unless the context dictates otherwise. Although any systems and methods similar or equivalent to those described herein can be used to practice or test examples of the present disclosure, the preferred systems and methods are now described.

Examples of the present disclosure will be described more fully after this with reference to the accompanying drawings in which like numerals represent like elements throughout the several figures and in which examples are shown. However, examples of the claims may be in many different forms and are not to be construed as limited to the examples set forth herein. The examples set forth herein are non-limiting examples and are merely examples among other possible examples.

Computer systems may generate a large amount of heat during operation primarily due to resistive heating in its electrical components. The amount of heat generated by a computer system is dependent on multiple factors which include the hardware design as well as the speed and number of calculations carried out by the computer system. For example, cryptocurrency mining hardware often carries out a large number of calculations and may generate enough heat to operate at temperatures that may damage the hardware if the heat is not managed. In particular, the hardware may be designed to operate at temperatures of about 80° C. to about 100° C., and if the temperatures exceed this, permanent damage and a significant reduction of the useful life of the hardware may occur. The low operating temperature of the hardware produces low-grade heat, which heats a medium to about 40° C. to about 60° C., is considered to be waste heat that is generally not recovered for most industrial processes or electricity generation. Accordingly, waste heat produced by cryptocurrency mining is vented to the atmosphere through convection or conduction. The manner by which the waste heat is transferred from the hardware is not limited.

However, recovery of low-grade heat may have some applications, such as space heating in homes and buildings. Low-grade heat may also have further applications in some manufacturing processes, such as food and beverage production or pulp and paper manufacturing. Nevertheless, recovering the low-grade waste heat from cryptocurrency mining is often not economically feasible due to the large capital expenditure, high overhead, and considerable infrastructure involved with a heat recovery system.

An apparatus is provided that uses an immersed, liquid-cooled mining system, which focuses on maximizing fluid outlet temperatures without overheating and thermal-throttling of the mining chips. In particular, the apparatus focuses on utilizing waste heat for district energy heating systems, which typically use inlet fluid temperatures of about 60° C. to about 80° C. It is to be appreciated by a person of skill with the benefit of this description that other applications using fluid of about 40° C. to about 60° C. are contemplated.

The apparatus described herein provides efficient heat transfer between the mining chips and fluid to reduce the temperature gradient between computational components and the fluid outlet temperature. Testing has shown that the apparatus may provide an approximate 25° C. difference between a high component temperature and the high fluid outlet temperature (about 115° C. at a mining chip with an approximate 90° C. outlet fluid temperature).

Referring to FIG. 1, an apparatus 50 to recover heat from multiple layers of computer components is generally shown. In the present example, the apparatus 50 includes a liquid-cooled cryptocurrency mining system to secure cryptocurrency by carrying out a large number of calculations. During operation, the apparatus 50 generates thermal energy that can be recovered and supplied or employed at different scales of commercial and residential use. In particular, the thermal energy generated by the apparatus 50 may be due to resistive losses from the continuous mining process. Furthermore, the apparatus 50 may provide a mechanism to efficiently recover heat energy from cryptocurrency mining, which may be utilized for other applications that otherwise use a separate heat source. In the present example, the apparatus 50 includes a chamber or tank 110, first and second processing units 205-1, 205-2 (generically, these processing units are referred to herein as "processing unit 205" and collectively referred to as "processing units 205"), an outlet 118, and a pump 124.

In the present example, the tank 110 is to store a fluid as part of the liquid-cooling system for the cryptocurrency mining system. The design of the tank 110 is not particularly limited and different designs are contemplated. In the present example, the tank 110 is designed to allow the fluid to flow in a generally horizontal direction from right to left. In operation, the tank 110 is to receive a cool fluid at an inlet. The fluid is heated inside the tank 110 as discussed in further detail below and the heated fluid is released from the tank 110 via an outlet 118 disposed on the tank 110. In other examples, the tank 110 may be configured for fluid flow in the opposite direction. Further examples are also contemplated where the tank 110 may be oriented vertically or at another angle, such as for accommodating for an available space in which the apparatus 50 is to be placed.

The fluid in the tank 110 is heated by the processing units 205 disposed therein. In the present example, each processing unit 205 forms a mining layer. In other examples, a mining layer may include more than a single processing unit 205. It is to be appreciated by a person of skill with the benefit of this description that the processing units 205 are not limited and may be positioned in various orientations to provide different fluid flow characteristics within the tank 110. In the present example, the processing units 205 are oriented substantially parallel to each other such that the fluid may flow between or around the processing units 205. In the present example, the processing units 205 include components to carry out computational operations, such as the mining for cryptocurrency. Accordingly, each processing unit 205 may include one or more computer boards, such as a hashing board, operating to mine cryptocurrency. The manner by which the processing units 205 transfer heat to the fluid is also not limited and may include immersing the processing units 205 in the fluid to provide direct conduction of heat from the components of the processing units 205 into the fluid. The components in each mining layer is not limited and may include power supply units, connectors, control units, hashing boards, wiring, circuit boards, etc. or any combinations thereof.

In the present example, the heat processing units 205 are completely immersed in the fluid such that heat may be conducted directly from the electrical components to the fluid via contact. In this example, it is to be understood by a person of skill with the benefit of this description that the fluid is to be a non-conductive or insulating fluid to avoid shorting of electrical components immersed in the same fluid. In other examples, the processing units 205 may include a protective covering or coating to cover exposed electrical contacts to protect against shorting and arcing. While the protective covering or coating is to be an electric insulator, the covering or coating is also to be a thermal conductor to allow for generated heat from each component behind the covering or coating to reach the fluid where the heat can be absorbed and carried away. By adding a protective covering or coating, it is to be appreciated that a wider variety of fluids, including conductive fluids, may be used.

The pump 124 is disposed proximate to the outlet 118 of the tank 110 to draw the fluid out of the tank 110. In the present example, the pump 124 is to generate a suction at the outlet 118 to draw out the fluid and to create a fluid flow in the space between the processing units 205. It is to be appreciated by a person of skill with the benefit of this description that the pump 124 further maintains a flow of the fluid at a predetermined flow rate through the entire system 100 to transfer heat from the tank 110 to the heat exchanger 120 as discussed in further detail below. The pump 124 is not particularly limited and may be any type of pump capable of generating a sufficient suction to provide sufficient fluid flow between and/or around the processing units 205 to remove heat generated during the mining process for cryptocurrency.

In the present example, a controller (not shown) may be used to control the operation of the pump 124. In particular, the controller may be connected to sensors at various locations along the fluid flow system, such as pressure sensors or temperature sensors, and control the operation of the pump 124 to maintain a substantially constant target pressure and/or temperature throughout the fluid flow system.

The apparatus 50 may be part of a larger system 100 to recover heat from multiple layers of computer components to be used in other applications. In addition to the apparatus 50 described above, the system 100 includes a heat exchanger 120 and a fluid transport system 121. It is to be appreciated by a person of skill with the benefit of this description that the system 100 may include further components to increase the capacity or efficiency of removing heat from the processing units 205.

The heat exchanger 120, also referred to as a heat exchanging unit, is to receive hot fluid from the tank 110. The heat exchanger 120 absorbs and removes heat from the fluid to transfer the heat out of the system 100. The manner by which the heat exchanger 120 removes heat from the fluid is not particularly limited and may carry out the removal via thermal conduction. In the present example, the heat exchanger 120 is constructed from materials which can separate the fluid from an external heating application, such as a space heating application, to provide hot air for a space or water heating source. Some examples of suitable materials to separate the fluid from the external environment while allowing thermal conduction include copper, stainless steel, aluminum, and other similar materials. The exact configuration of the heat exchanger 120 is not particularly limited. For example, the fluid flow through the heat exchanger 120 may follow a tortuous route to increase surface area along the path for heat transfer. In other examples, the heat exchanger 120 may include internal fins, baffles, or protrusions to increase heat transfer efficiency by increasing the surface area.

The fluid transport system 121 is to provide a fluidic connection between the tank 110, the heat exchanger 120, and the pump 124. In the present example, the fluid transport system 121 includes a network of pipes through which the fluid may travel. The fluid may be moved through the fluid transport system 121 with pressure applied by the pump 124. In some examples, additional pumps (not shown) may be added along the fluid transport system 121 to maintain pressure throughout the entire system 100. In further examples, the fluid transport system 121 may also include components to address any volume change in the fluid transport system 121. For example, the fluid transport system 121 may include a bladder tank to allow for expanding volumes, or a tank that is open to atmosphere.

Figure 2:
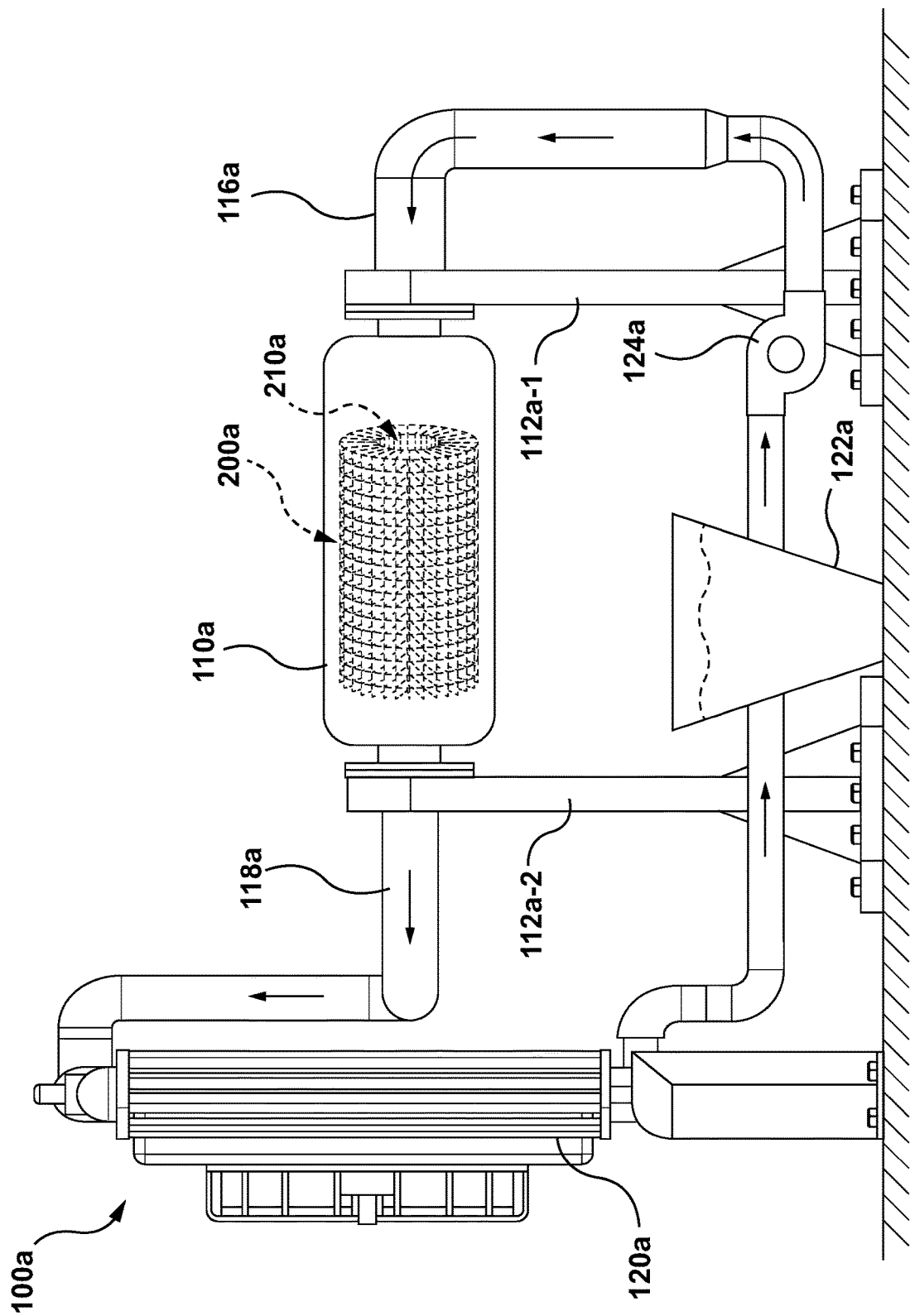
FIG. 2 is a view of another example of a system to recover heat from multiple layers of computer components.
Figure 3:
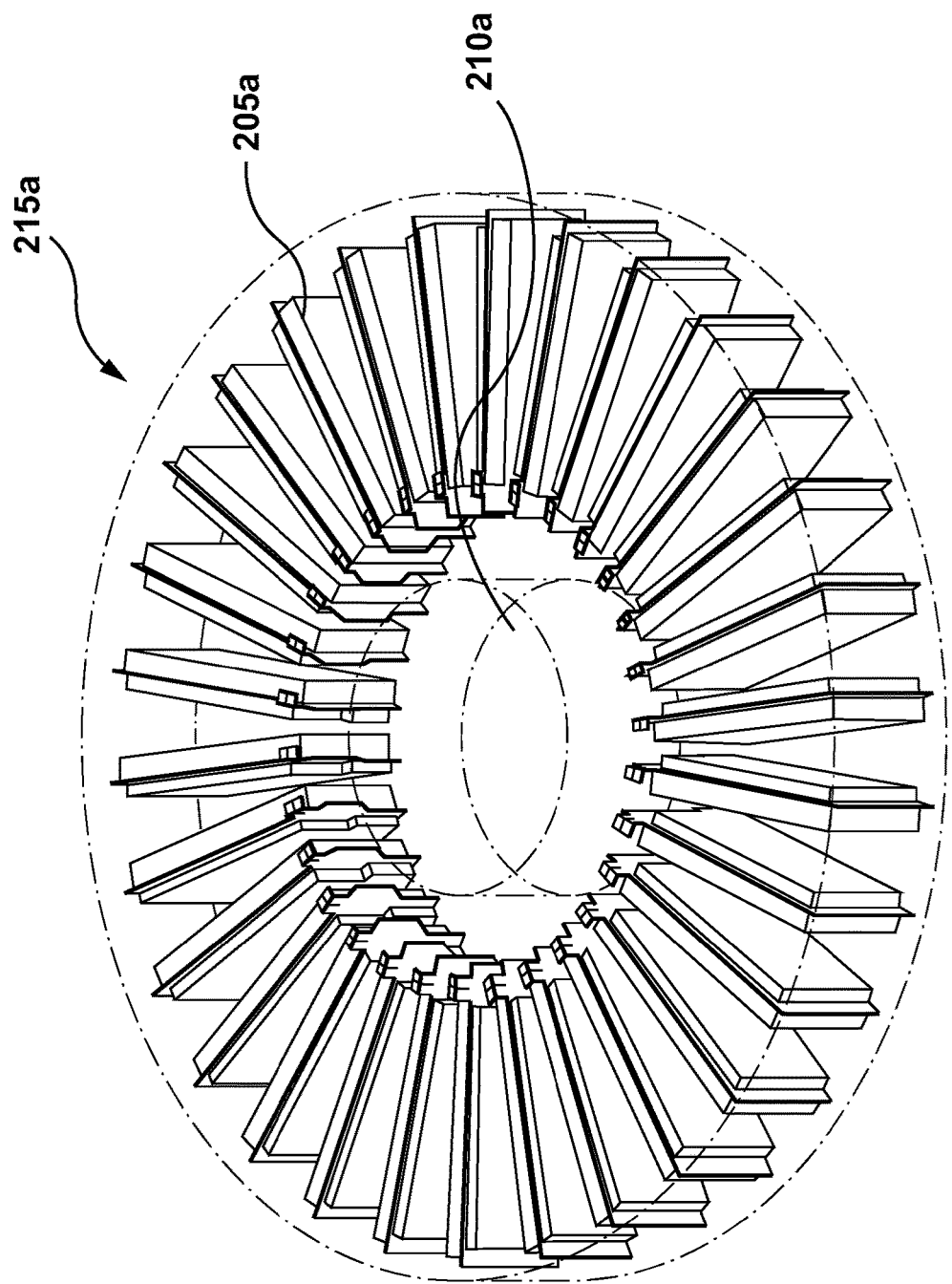
FIG. 3 is a perspective view of a radial mining layer of the system shown in FIG. 2.

Referring to FIG. 2, another system 100*a* to recover heat from multiple layers of computer components to be used in other applications is shown. Like components of the system 100*a* bear like reference to their counterparts in the system 100, except followed by the suffix "*a*". In the present example, the system 100*a* includes a multi-stacked structure 200*a* of a plurality of radial mining layers 215*a*, as shown in FIG. 3, for utilizing heat dissipated during cryptocurrency mining. The system 100*a* may generate energy that can be supplied or employed at different scales of commercial and residential use. For example, the energy generated by the system 100*a* may be heat energy generated during the mining process of cryptocurrency. It is to be understood by a person of skill with the benefit of this description that cryptocurrency mining utilizes electrical power to perform algorithmic calculations with computing hardware, producing heat as a waste product from the inherent resistance in the computer components. The system 100*a* may provide a mechanism to efficiently capture this heat energy and deliver it to external systems to be used in various heating processes.

The system 100*a* may include a plurality of radial mining layers 215*a* arranged in the multi-stacked structure 200*a* with a central annular section 210*a* extending from a first side to a second and opposite side of the multi-stacked structure 200*a*. The plurality of radial mining layers 215*a* may be enclosed in a tank 110*a* coupled to the central annular section 210*a*. In the present example, the tank 110*a* may be configured to enclose the ends of the central annular section 210*a* using a plurality of fasteners (not shown). The system 100*a* may also include supports 112*a*-1 and 112*a*-2 (generically, these supports are referred to herein as "support 112*a*" and collectively referred to as "supports 112*a*" and also refers to supports 112-1 and 112-2 of FIG. 1) coupled to a base at one end using carious joining techniques, such as fastening, welding, or clamping. The supports 112*a* may be an integral component of the tank 110*a*, as either a feature of the tank 110*a* or as a separate component that is permanently or non-permanently joined to the tank 110*a*. The base of the supports 112*a* may be a frame structure or assembly consisting of one or more manufactured members to support the weight of the tank 110*a* and multi-stacked structure 200*a*. The base of the supports 112*a* may support additional components of the system 100*a*, and may be joined or supported by a load bearing surface such as a floor, wall, or ceiling. In further examples, the base of the supports 112*a* may itself be a load bearing surface, with components of system 100*a* mounted to it. In the present example, the annular section 210*a* is configured to mate with inlet pipe 116*a* (or inlet pipe 116 of FIG. 1) at one end and outlet pipe 118*a* on the opposite end.

Figure 5A:
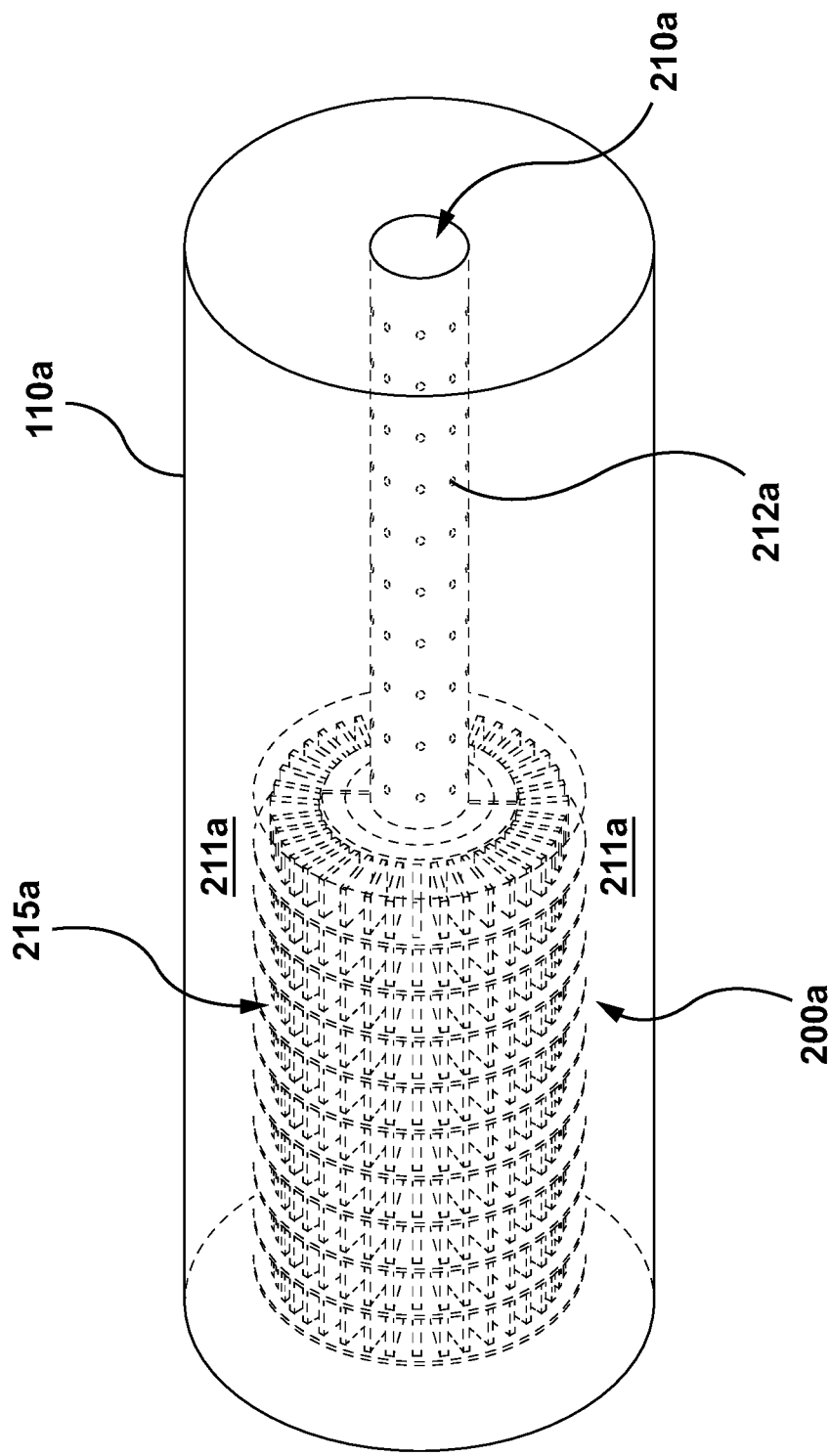
FIG. 5A is a view of an example of a multi-stacked structure of the system shown in FIG. 2.

The system 100*a* may operate in a manner that circulates a fluid through the system 100*a* and the multi-stacked structure 200*a* from the inlet pipe 116*a*. The fluid flows into the central annular section 210*a*. In the present example, the central annular section 210*a* includes a plurality of vent holes 212*a*, as shown in FIG. 5A, integrated at specific distances along the length of the central annular section 210*a*. The plurality of vent holes 212*a* are configured to supply fluid towards each radial mining layer 215*a*. In the present example, the fluid may be driven through each radial mining layer 215*a* by pressure from the pump 124*a*. When the fluid flows through each radial mining layer 215*a*, the fluid absorbs heat via convection. In the present example, the fluid is a non-conductive fluid with high specific heat capacity to be compatible with the electrical components and absorb more heat. Once the fluid has absorbed the heat, the heated fluid is released from the tank 110*a* into the outlet pipe 118*a*.

The manner by which the fluid flows through the multi-stacked structure 200*a* in the tank 110*a* is not particularly limited. In the present example, the fluid is supplied from the inlet pipe 116*a* connected to an inlet of the side multi-stacked structure 200*a* in the tank 110*a*. The fluid is delivered to the central annular section 210*a* of the multi-stacked structure 200*a* and may flow in a helical pattern at the perimeter of the plurality of the radial mining layers 215*a*. The plurality of radial mining layers 215*a* forming the multi-stacked structure 200*a* may increase the temperature of the fluid from the heat generated by a mining process inside the radial mining layers 215*a*. After the fluid is heated, the hot fluid is released to the outlet pipe 118*a* and toward the heat exchanger 120*a*. It is to be appreciated by a person of skill with the benefit of this disclosure that the fluid entering the tank 110a via the inlet pipe 116a is to replace the fluid released via the outlet pipe 118a. In the present example, the outlet pipe 118a is connected to the outlet side of the central annular section 210a to release the hot fluid from the plurality of radial mining layers 215a into the heat exchanger 120a. The heat exchanger 120a is configured to cool down the hot fluid using surrounding air in the present example. In other examples, the heat exchanger 120a may cool down the hot fluid by transferring thermal energy to a second fluid, which may have other applications, such as for domestic hot water.

In the present example, the system 100a further includes a reservoir 122a connected to the heat exchanger 120a at one end and to a pump 124a at another end. The reservoir 122a stores a volume of fluid to accommodate thermal expansion of the fluid in the system 100a and to dampen pressure and thermal temperature spikes in system 100a.

In the present example, each of the plurality of radial mining layers 215a may include a plurality of processing units 205a arranged radially around annular section 210a. The multi-stacked structure 200a of the plurality of radial mining layers 215a may include at least two layers of radial mining layers 215a with the plurality of processing units 205a. Each radial mining layer 215a may be of a predefined dimension. In one example, each radial mining layer 215a may be about 44 inches in diameter. However, in other examples, the radial mining layer 215a may be larger or smaller.

Each of the plurality of radial mining layers 215a may be coupled to the heat exchanger 120a at one end using one or more outlet pipes 118a. The recovered heat from the radial mining layers 215a may be used for a variety of different applications. For example, the heat exchanger 120a may be installed at a facility and configured to radiate the heat energy into the ambient atmosphere of the facility. In this example, a fan may be included to increase thermal heat transfer into the ambient air. In another example, the heat exchanger 120a may be installed in a mechanical room and configured to connect with a fluid heat exchanger to transfer heat from the system 100a to a hot water supply. The plurality of processing units 205a of each of the plurality of radial mining layers 215a may raise the temperature of the fluid from the heat generated by cryptocurrency mining. After the fluid is heated, the hot fluid is transferred towards the heat exchanger 120a via the outlet pipe 118a. After releasing heat to the heat exchanger 120a, the fluid is drawn by the pump 124a, either via reservoir 122a or directly from the heat exchanger 120a via piping, to which reservoir 122a is also connected. In some examples, the fluid may be supplied from the pump 124a to the plurality of radial mining layers 215a in a closed-loop cycle. It can be noted that such use of the system 100a facilitates a balanced closed-loop system, generating heat energy in mining layers 215a and dissipating or releasing this energy in heat exchanger 120a.

The operation of the reservoir 122a is not particularly limited. For example, the reservoir 122a may be configured to store a predefined amount of fluid used to supply the multi-stacked structure 200a with fluid for the operation of the system 100a. The dimensions of the reservoir 122a is not limited and may be of a predefined dimension to accommodate the predefined amount of fluid. In the present example, each of the plurality of radial mining layers 215a is about four feet high and about eight feet long. In the present example, the fluid may be water or any non-conductive fluid. The pump 124a may be controlled by adjusting its engine speed either manually by setting a revolutions per minute setpoint, or automatically with a software control loop.

Referring to FIG. 3, a single radial mining layer 215a of the multi-stacked structure 200a is shown. Each of the plurality of radial mining layers 215a of the multi-stacked structure 200a may include a plurality of processing units 205a mounted in a circular fashion around annular section 210a. In the present example, a single layer among the multi-stacked structure 200a may include eight control boards (not shown). Each control board may be configured to control a predefined number of processing units 205a, such as three processing units 205a. In other examples, a control board may control more processing units 205a or fewer processing units 205a.

In the present example, each control board uses an internet connection to facilitate cryptocurrency mining. The manner by which the internet connection is established is not limited. For example, each control board may receive an internet connection from an ethernet switch that is connected to the internet via an external source, which may be a wired or wireless connection. The control board may be programmed to facilitate mining cryptocurrency carried out by each processing unit 205a and may adjust the operation of each processing unit 205a based on external inputs.

Figure 4:
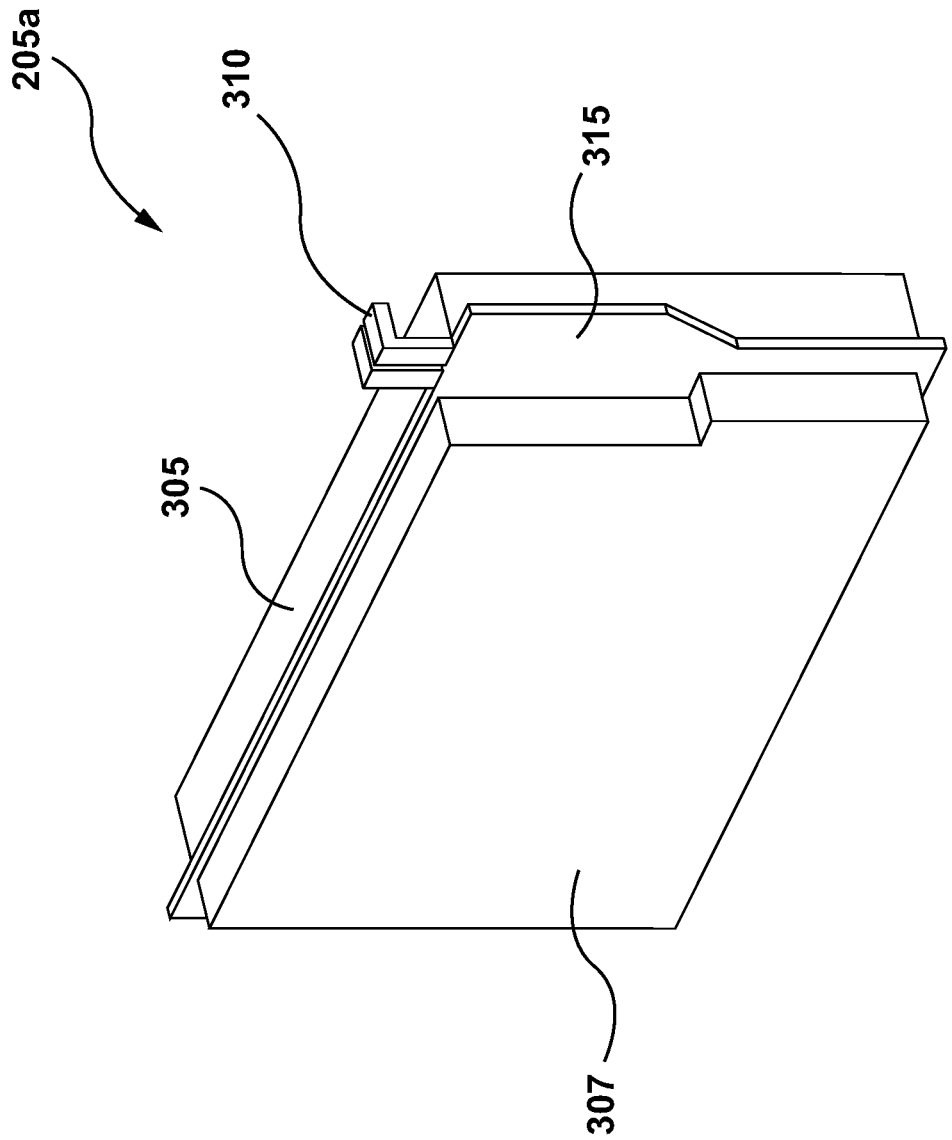
FIG. 4 is a perspective view of a processing unit of the system shown in FIG. 2.

FIG. 4 generally shows a processing unit 205a from the radial mining layer 215a. The processing unit 205a includes a hashing board 315. The hashing board 315 is not limited and may include many designs. For example, the hashing board 315 may be a printed circuit board having a plurality of integrated circuits, which may also be referred to as chips. In one example, the chips may be located on both sides of the hashing board 315 and housed under a first heatsink 305 and a second heatsink 307. Heatsink 305 and heatsink 307 may be single units or a collection of separate heatsinks mounted on each hashing board 315. In another example, chips may be located on at least one side of the PCB of hashing board 315, and may or may not be housed under a heatsink 305 or heatsink 307. In some examples, the heatsink 305 and/or the heatsink 307 may be omitted if the fluid can provide sufficient cooling. In an example without heatsinks, heat may be transferred directly from the hashing board 315 to the fluid of system 100a. Each hashing board 315 may comprise connectors 310 integrated at one end of each hashing board 315. In the present example, each of the plurality of hashing boards 315 may be coupled to power supply terminals (not shown) with the connectors 310. The power supply terminals may be connected to a direct current (DC) power supply source via connectors 310. The plurality of chips on each hashing board 315 is not limited may be referred to as a plurality of mining chips disposed over the surfaces of each hashing board 315. It is to be understood that although each mining chip is configured to perform a predefined mining operation in the present example, other examples may involve other types of chips carrying out complicated calculations.

Figure 5B:
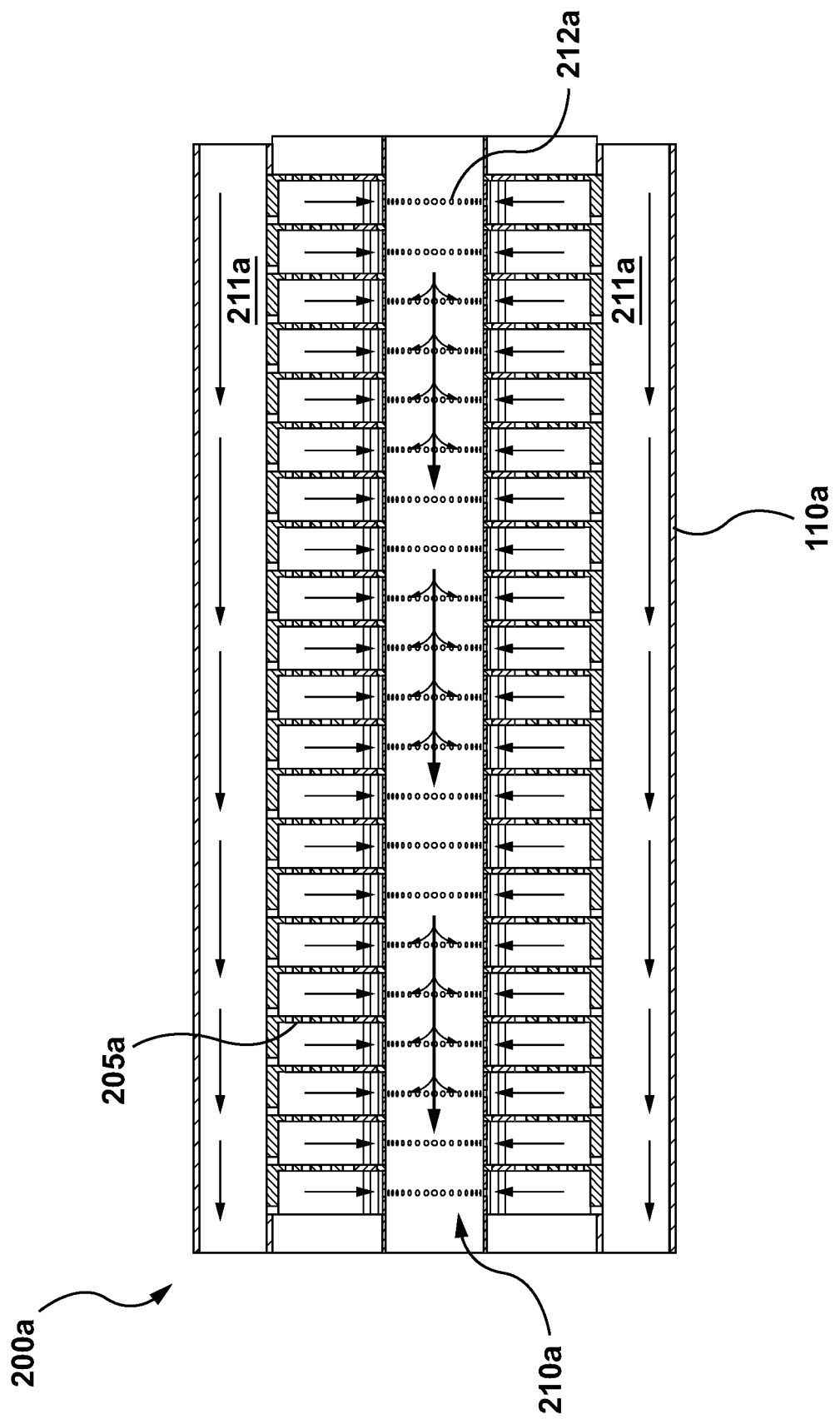
FIG. 5B is a cross sectional view of the multi-stacked structure of the system shown in FIG. 2.

Referring to FIG. 5A and FIG. 5B, the tank 110a is a substantially cylindrical housing. In some examples, a second cylindrical housing is coaxially placed over the multi-stacked structure 200a of the plurality of radial mining layers 215a. The second cylindrical housing may be disposed along the circumference of the multi-stacked structure 200a of the plurality of radial mining layers 215a. The first cylindrical housing may be disposed coaxially over the second cylindrical housing with a flow area 211a between the cylindrical housing and the outer edge of the multi-stacked structure 200a. The flow area 211a between the cylindrical housing and the outer edge of the multi-stacked structure 200a may be provided for fluid flowing out of the circumference of the multi-stacked structure 200a of the plurality of radial mining layers 215a.

The central annular section 210a within the multi-stacked structure 200a of the plurality of radial mining layers 215a may comprise the plurality of vent holes 212a, which are integrated along the circumferential length of the central annular section 210a in a ring-shaped manner. It can be noted that the plurality of vent holes 212a are integrated, along the circumferential length of the central annular section 210a, for the plurality of radial mining layers 215a, such that each radial mining layer 215a of the multi-stacked structure 200a may be provided with each of the plurality of vent holes 212a. Each radial mining layer 215a may be disposed over each of the plurality of vent holes 212a, such that a flow of fluid from the central annular section 210a may flow into each of the plurality of radial mining layers 215a via each of the plurality of vent holes 212a.

Referring to FIG. 5B, a sectional view of the multi-stacked structure 200a of the plurality of radial mining layers 215a is provided to illustrate the flow of fluid within the multi-stacked structure 200a of the plurality of radial mining layers 215a. The fluid may be supplied from the pump 124a, as described in the system 100a. The fluid may be supplied from an end of the central annular section 210a, as shown by the flow arrows. The fluid may flow into each of the plurality of radial mining layers 215a via each of the plurality of vent holes 212a, as shown by the flow arrows. It is to be appreciated by a person of skill with the benefit of this description that each radial mining layer 215a may have a respective plurality of vent holes 212a to receive fluid flow. In the present example, the fluid flow received by each of the plurality of radial mining layers 215a flows over each of the plurality of processing units 205a to absorb heat produced during mining operation of each processing unit 205a.

After absorbing heat from the plurality of processing units 205a, the fluid is directed towards the circumference of the multi-stacked structure 200a and thereby into the flow area 211a between the cylindrical housing and outer edge of the multi-stacked structure 200a. Furthermore, the fluid within the flow area 211a may be directed towards the outlet pipe 118a via the central annular section 210a. The heated fluid from the plurality of radial mining layers 215a is then provided to the heat exchanger 120a via the outlet pipe 118a.

Figure 6A:
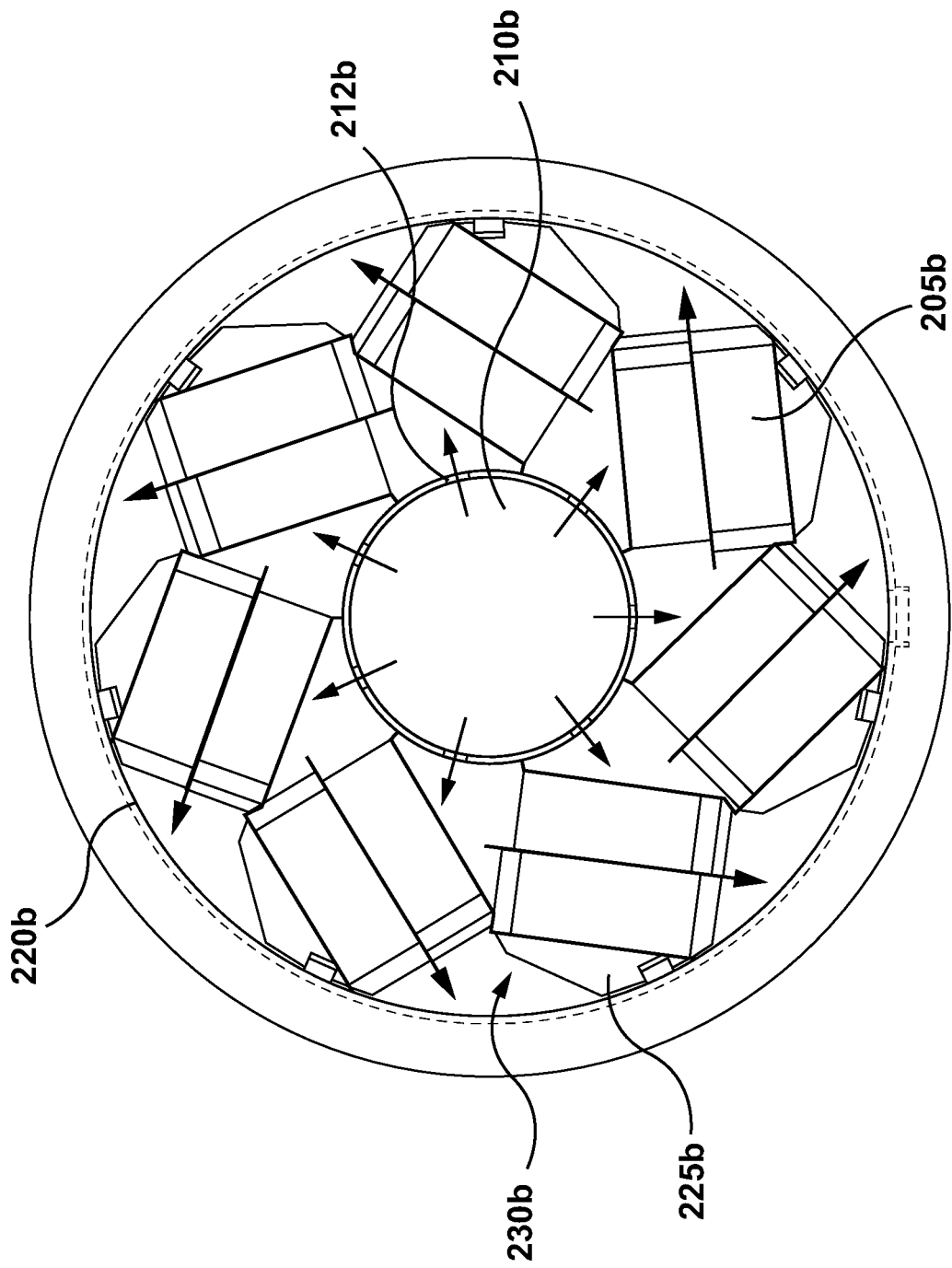
FIG. 6A is a side view of another example of a multi-stacked structure.
Figure 6B:
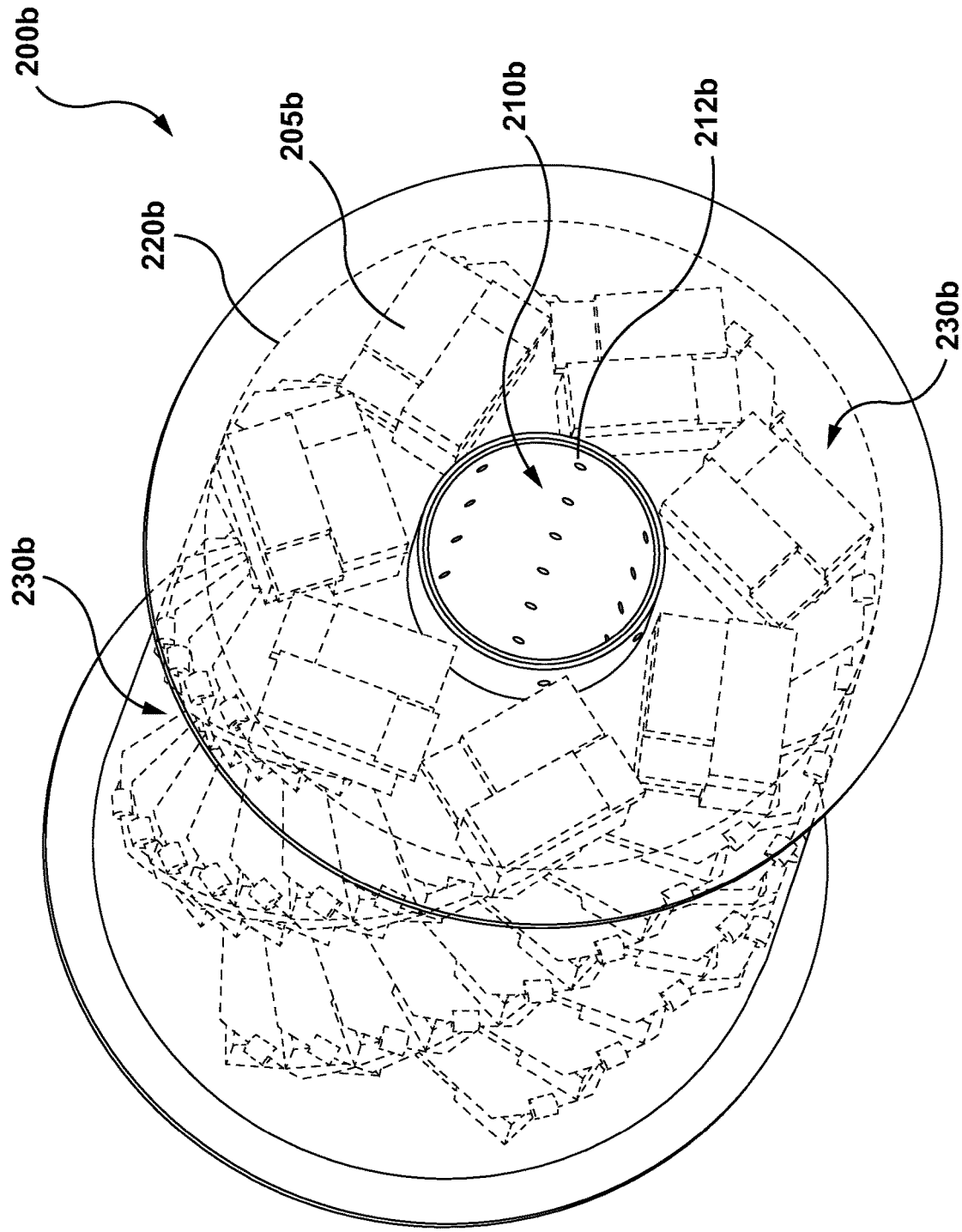
FIG. 6B is another view of an example of a multi-stacked structure shown in FIG. 6A.

Referring to FIGS. 6A and 6B, another example of a multi-stacked structure 200b of the plurality of processing units 205b is shown. Like components of the multi-stacked structure 200b bear like reference to their counterparts in the multi-stacked structure 200a, except followed by the suffix "b". FIGS. 6A and 6B illustrate one possible structure and method for inducing helical flow within a multi-stacked structure 200b of the plurality of processing units 205b. In the present example, fluid enters annular section 210b and is driven through holes 212b, with plates 225b dividing each layer such that each set of holes 212b at a certain axial length along annular section 210b supplies fluid to only one processing unit 205b. Once fluid has entered a processing unit 205b from holes 212b, the fluid may be diverted by flow guides through the processing units 205b and towards the inner wall 220b of the tank. Flow guides may divide each mining layer into three or more flow channels, which prevent fluid from crossing into another flow channel within a single mining layer. Further, fluid in a single mining layer may be diverted in such a manner as to induce some rotation of the fluid volume along the central axis of annular section 210b. Each processing unit 205b may consist of one control board and at least one hashing board 315, and may or may not also comprise a power supply unit, with each component being coupled together in a housing or frame. In another example, each processing unit 205b may be a collection of two or more hashing boards 315 arranged in an orderly fashion. In the present example, fluid enters annular section 210b and is driven through seven radial holes 212b into seven corresponding flow channels created by bounding plates 225b and seven flow guides. The fluid is then driven through 14 processing units 205b (2 in each flow channel), where it absorbs heat produced by the cryptocurrency mining process before exiting into a flow channel 230b.

Flow channels 230b provide helical flow paths for fluid as it travels towards a fluid outlet at the side. Helical flow induced by flow channels 230b encourages fluid mixing within the multi-stacked structure 200b of the plurality of radial mining layers, which may reduce any heat concentrations in the processing unit 205b that arise from unbalanced flow and heat gradient driven convection. Each mining layer has fluid exit areas along their periphery, and flow channels 230b may be formed by offsetting each mining layer and their respective fluid exit areas.

Figure 7:
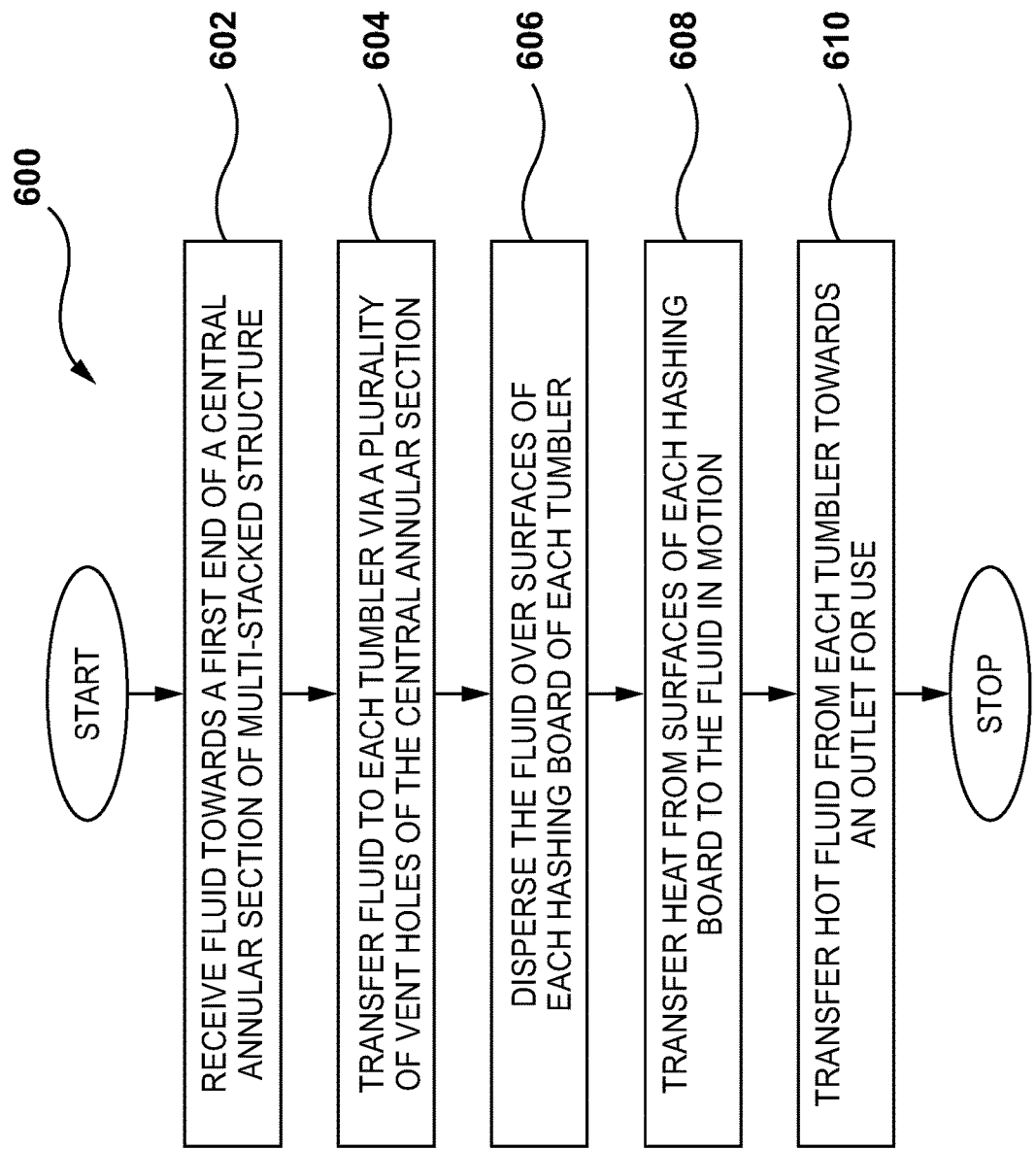
FIG. 7 is a flowchart of an example process of recovering heat from multiple layers of computer components.

Referring to FIG. 7, a flowchart of steps for recovering heat generated by the cryptocurrency mining process is shown. The method for recovering heat generated by the cryptocurrency mining process is explained with reference to the system 100a and steps shown in the method 600. One skilled in the art with the benefit of the present description will appreciate that, for this and other processes and methods disclosed herein, the functions performed in the processes and methods may be implemented in differing orders. Furthermore, the outlined steps and operations are only provided as examples. Some of the steps and operations may be optional, combined into fewer steps and operations, or expanded into additional steps and operations without detracting from the disclosed examples.

In the present example, the system 100a receives fluid supplied towards the central annular section 210a of the multi-stacked structure 200a of the plurality of radial mining layers 215a at step 602. The fluid may be supplied via the pump 124a. The fluid is then transferred to each of the plurality of radial mining layers 215a via the plurality of vent holes 212a of the central annular section 210a at step 604. In the present example, the central annular section 210a includes a plurality of vent holes 212a integrated at specific distances along the length of the central annular section 210a as discussed above. The plurality of vent holes 212a are configured to supply fluid towards each radial mining layer 215a. The fluid is then dispersed over the surfaces of each hashing board 315 of each radial mining layer 215a at step 606. In some examples, the plurality of vent holes 212a may be configured to provide substantially equal flow through each mining layer 215a. By equalizing the flow, the hashing board 315 may be configured to transfer heat generated from the mining process to the fluid uniformly across the multi-stacked structure 200a. As discussed above, the fluid flow at the perimeter of the radial mining layers 215a may be helical to encourage fluid mixing. The helical flow also provides a more even flow through each mining layer 215a and reduces any hotspots or areas with a higher heat concentration. In the present example, the fluid flows from one end of each hashing board 315 to the opposite end of each hashing board 315. At the opposite end away from the central annular section 210a, the flow may be transferred towards the outlet of the tank 110a. As the fluid flows over the hashing board 315, heat is transferred to the fluid in motion at step 608. The heated fluid then flows from each radial mining layer 215a towards the outlet pipe 118a connected to an end of the central annular section 210a at step 610. The fluid is heated by the plurality of hashing boards 315 and supplied to the heat exchanger 120a to be used for a secondary application.

It is to be appreciated by a person of skill with the benefit of this description that the apparatus may be constructed in a modular fashion, which may facilitate the installation of the apparatus at new locations, and may provide scalability. By generating economic value from both cryptocurrency accumulation and heat generation, the system 100 or the system 100a may be able to produce heat at a lower cost than an equivalent electrical resistance heating system. Furthermore, the apparatus may avoid significant carbon emissions if the lower cost heat allows the apparatus to replace or supplement fossil fuel based heating systems. Furthermore, the unique architecture of the apparatus may provide a more ecological way of mining cryptocurrency. Therefore, the apparatus facilitates mining cryptocurrency and sustainably recovering the heat dissipated during cryptocurrency mining. Such a system facilitates the advantage of producing a dual revenue stream of cryptocurrency and electrically generated heat.

Figure 8:
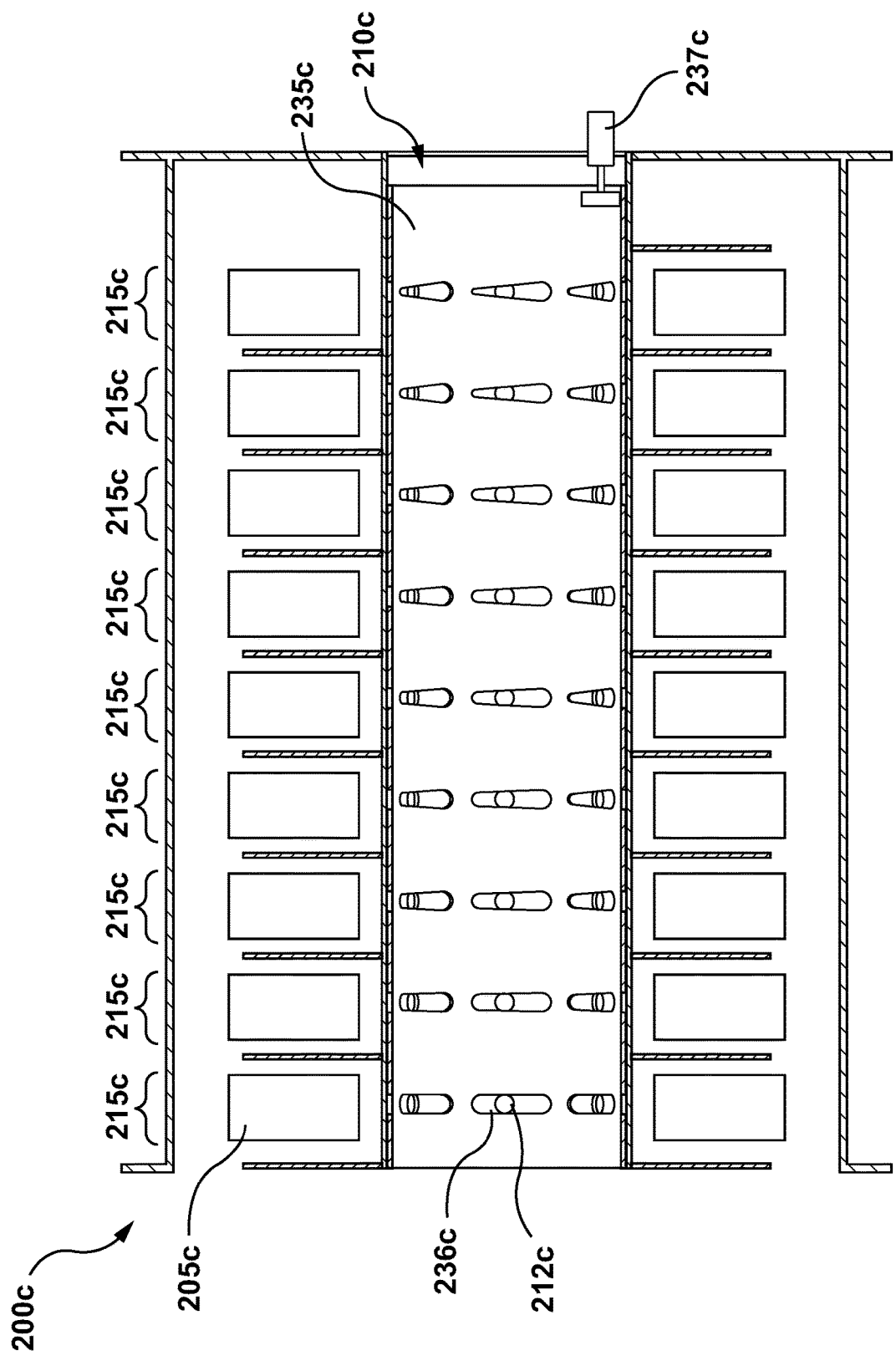
FIG. 8 is a cross sectional view of another example of a multi-stacked structure.

Referring to FIG. 8, another example of a multi-stacked structure 200c of the plurality of processing units 205c is shown. Like components of the multi-stacked structure 200c bear like reference to their counterparts in the multi-stacked structure 200a, except followed by the suffix "c". In the present example, the multi-stacked structure 200c includes a flow balancing system to adjust flow rates into the radial mining layers 215c. A hollow cylindrical section 235c is placed within annular section 210c. The cylindrical section 235c can rotate relative to annular section 210c. The cylindrical section 235c includes slots 236c that align with vent holes 212c of the annular section 210c. The slots 236c are configured to restrict the opening size of vent holes 212c. In the present example, the slots 236c vary in width along the length of the slot 236c. Accordingly, as the cylindrical section 235c is rotated, the slots 236c may provide a change in opening size to vent holes 212c to increase or decrease flow constriction into the radial mining layers 215c. The variation of the slots 236c may also vary across the cylindrical section 235c to provide different sized effective openings along the annular section 210c to accommodate for pressure variations across the multi-stacked structure 200c. By selecting the variation of the slots 236c based on an expected fluid flow and behavior, substantially even flow of fluid across each radial mining layer 215c of the multi-stacked structure 200c can be obtained. For example, a linear pressure drop may be expected as fluid travels from the vent holes 212c near the inlet toward the vent holes 212c near the outlet which will correspond to higher fluid flow rates into the vent holes 212c near the inlet, and lower fluid flow rates at the vent holes 212c near the outlet. Accordingly, the varying sizes of radial slots 236c at each layer can provide flow restriction at each layer with the inverse behavior of the expected system to provide flow rates that can be substantially uniform across each radial mining layer 215c. In the present example, the multi-stacked structure 200c includes a motor 237c coupled to cylindrical section 235c to provide powered rotation of cylindrical section 235c to adjust the position of the slots 236c relative to the venting holes 212c to control the restriction of fluid flow.

Figure 9:
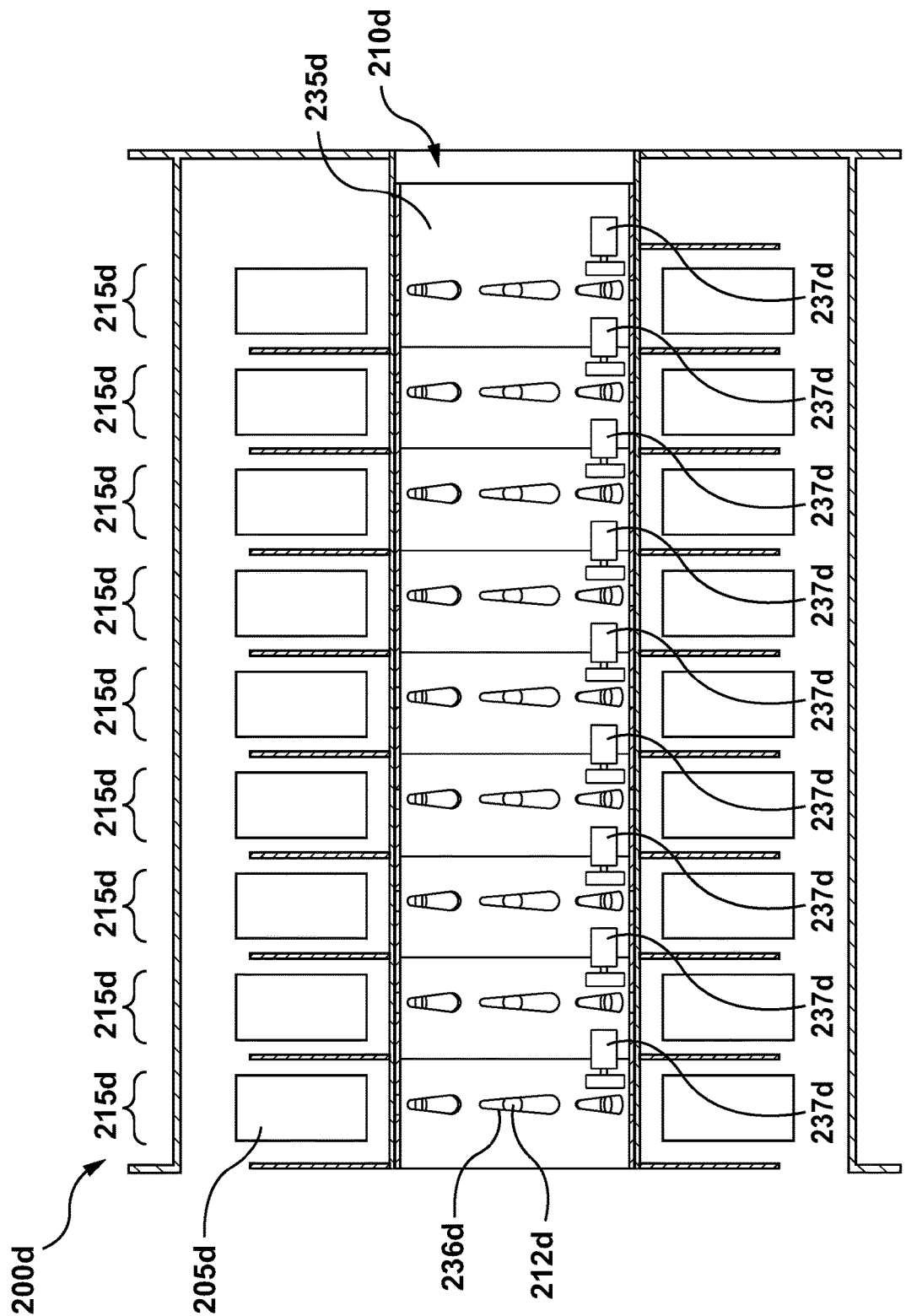
FIG. 9 is a cross sectional view of another example of a multi-stacked structure with independent control of the annular rings of the cylindrical section.

Referring to FIG. 9, another example of a multi-stacked structure 200d of the plurality of processing units 205d is shown. Like components of the multi-stacked structure 200d bear like reference to their counterparts in the multi-stacked structure 200a, except followed by the suffix "d". In the present example, the multi-stacked structure 200d includes a cylindrical section 235d separated into multiple annular sections, with one section per mining layer 215d. Each separate annular section of the cylindrical section 235d is free to rotate relative to its adjacent separate annular section. The slots 236d are aligned with vent holes 212d at each layer, and may decrease in size from one end of the slot 236d to the other. In the present example, each separate annular section may be coupled with a motor 237d or other means of independent rotation. As each separate annular section of the cylindrical section 235d is rotated, the opening sizes to vent holes 212d at that mining layer 215d are changed, increasing or decreasing restriction and thereby controlling flow into each radial mining layer 215d. Accordingly, it is to be appreciated by a person of skill with the benefit of this description that independent control of the separate annular sections allows for the adjustment of flows to be substantially uniform across all radial mining layers. In further examples, flow sensors and controllers may be added to automate the adjustments which may accommodate for pressure variations at the inlet.

Figure 10:
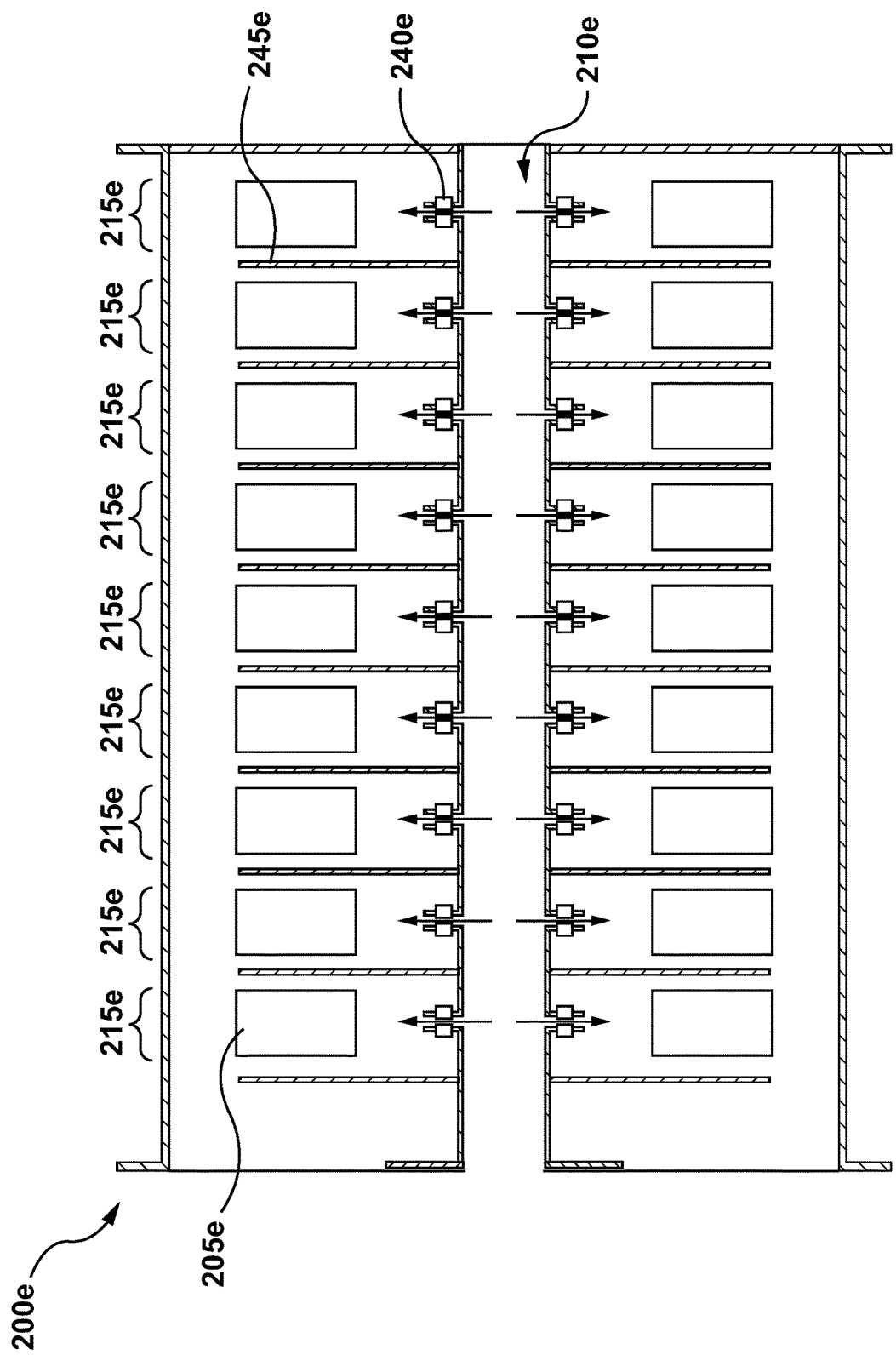
FIG. 10 is a cross sectional view of another example of a multi-stacked structure with independent fluid control valves.

Referring to FIG. 10, another example of a multi-stacked structure 200e of the plurality of processing units 205e is shown. Like components of the multi-stacked structure 200e bear like reference to their counterparts in the multi-stacked structure 200a, except followed by the suffix "e". In the present example, the multi-stacked structure 200e includes an alternative flow balancing. In the present example, fluid is supplied to the annular section 210e. The annular section 210e is coupled with a plurality of fluid control valves 240e, which are powered by electric means to control the rate of fluid flow through each valve. In the present example, the control valves 240e may be disposed on the annular section 210e. However, in other examples, the control valves 240e may be mounted on a separate fluid supply tube (not shown) disposed within the annular section 210e. The annular section 210e includes at least one valve 240e coupled radially at each mining layer 215e. In the present example, fluid walls 245e may be placed between each radial mining layer 215e to separate the output of the control valves 240e. In examples with a separate supply tube smaller in diameter than the annular section 210e, the fluid may pass through buffer volumes between the supply tube and the annular section 210e before reaching the radial mining layer 215e. The buffer volumes may provide flow buffering to even the flow across the radial mining layer 215e.

Figure 11:
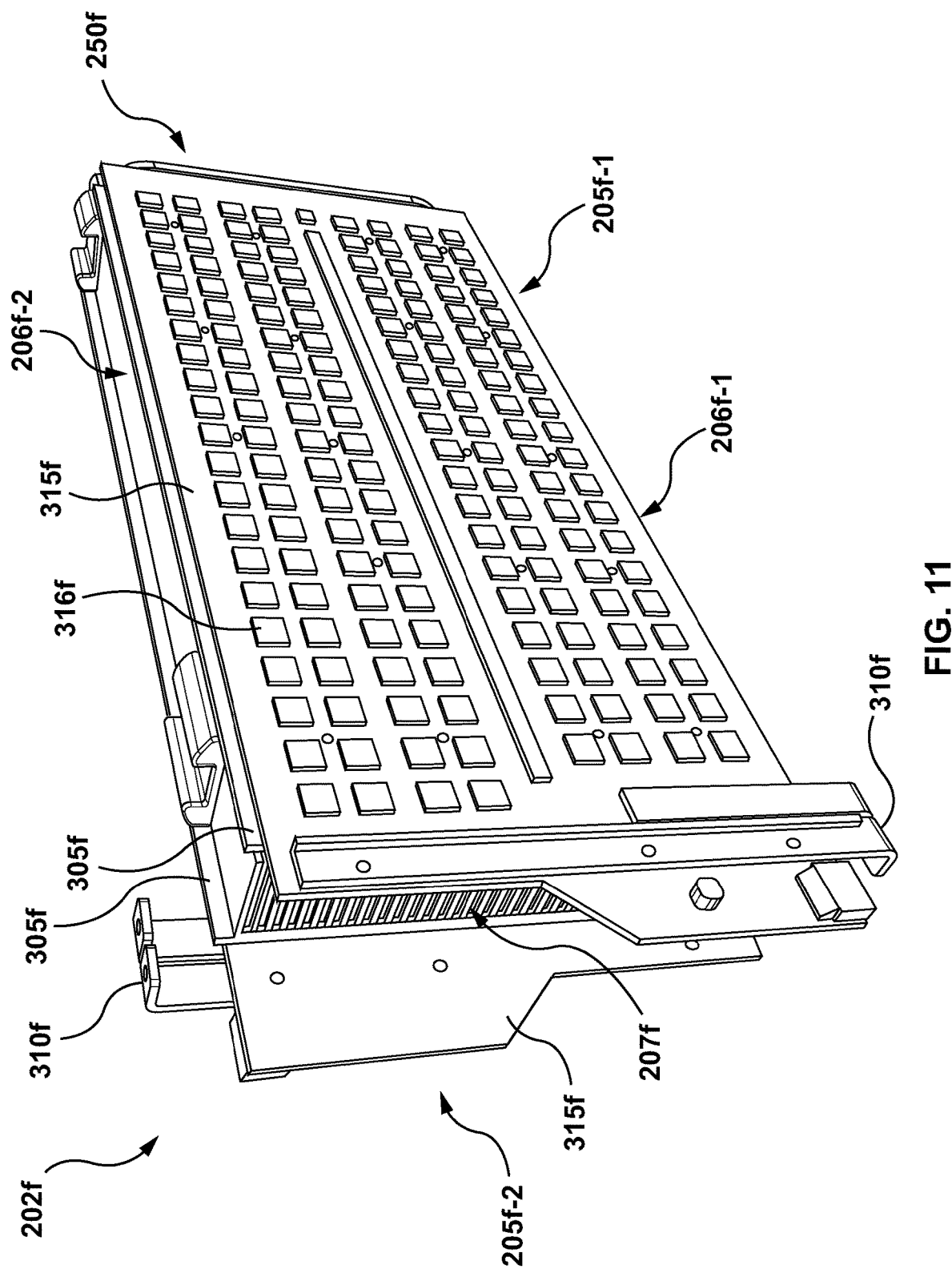
FIG. 11 is a perspective view of an example of a sub-structure to recover heat from multiple layers of computer components.

Referring to FIG. 11, a substructure 202f of the plurality of processing units 205f-1 and 205f-2 (generically, these processing units are referred to herein as "processing unit 205f" and collectively referred to as "processing units 205f") to recover heat from computer components is generally shown. In the present example, the substructure 202f includes a pair of liquid-cooled cryptocurrency mining processing units 205f to secure cryptocurrency by carrying out a large number of calculations. The substructure 202f may be part of a multi-stacked structure 200f shown in FIG. 12.

In the present example, a system for mining cryptocurrency includes a power supply unit 255f, a control board 257f, and one or more processing units 205f. The power supply unit 255f is to convert an AC input to DC voltage for the processing units 205f. The processing units 205f are the main units that perform cryptocurrency mining calculations, and are typically composed of a hashing board 315f with one or more heatsinks 305f. The hashing boards 315f are made from a printed circuit board with one or more ASIC mining chips 316f. The heatsinks 305f are used to dissipate the heat generated in the mining chips 316f. In the present example, each of the processing units 205f includes a heatsink 305f thermally coupled thereto to remove heat for each of the mining layers. It is to be appreciated by a person of skill with the benefit of this description that in some examples, the heatsink 305f may be omitted and the heat is transferred solely with fluid contact between the hashing boards 315f. The control board 257f typically receives and manages internet connectivity, and controls the hashing boards 315f.

In the present example, the substructure 202f couples the processing unit 205f-1 with the processing unit 205f-2. In this example, each processing unit 205f may form a mining layer by itself. The heatsink 305f of the processing unit 205f-1 extends to engage the processing unit 205f-2. Similarly, the heatsink 305f of the processing unit 205f-2 extends to engage the processing unit 205f-1. Accordingly, the heatsinks 305f are disposed within the space between the processing units 205f. The heatsinks 305f are not limited and may have various designs. In the present example, the heatsinks 305f have a linear finned design which includes a plurality of parallel fins extending the length of the heatsink 305f. It is to be appreciated that an edge fin of the heatsink 305f of the processing unit 205f-1 may form a wall 206f-1 along one side of the substructure 202f, and the edge fin of the heatsink 305f of the processing unit 205f-2 may form another wall 206f-2 along an opposite side of the substructure 202f. Although the present examples have the wall 206f-1 and the wall 206f-2 extend from the processing units 205f-1 and 205f-2, respectively, it is to be appreciated by person of skill with the benefit of this description that the walls 206f-1 and 206f-2 may extend from the same processing unit 205f or may be a separate component added to the substructure 202f.

The walls 206f-1 and 206f-2 form a channel extending the length of the processing units 205f through the substructure 202f. In the present example, the channel provides a structural feature through which fluid may flow. By directing the fluid through the channel between the processing units, faster fluid flow over the heatsinks 305f in the space between the processing units 205f may be achieved which may increase the efficiency at which heat is transferred from the processing units 205f.

In the present example, each hashing board 315f includes mining chips 316f on a side of the printed circuit board, with the other side having a bare circuit board mounted to a linear finned heatsink 305f. The printed circuit board may be an aluminum or otherwise thermally conductive material to improve heat transfer from the mining chips 316f, through the printed circuit board, to the heatsink 305f. Each printed circuit board is provided with power via busbars, with each busbar connected to a power supply via connectors 310f.

The heatsinks 305f at not particularly limited and may be any type of linearly finned heatsink. For example, the heatsinks on both of the processing units 205f may be substantially identical such that the fins are uniform in length and separation. When two processing units 205f are coupled together, the heatsinks 305f mate to form a plurality of channels 207f within the space between the processing units 205f. The channels 207f direct fluid flow through the coupled heatsinks 305f to the exit manifold 250f. The exit manifold 250f seals against the heatsink 305f and an outlet plate 260f to reduce leakage. In other examples, the linear finned heatsinks 305f may be replaced with a single closed channel heatsink, which may reduce any ingress of colder fluid from outside the channels 207f due to leaks between the fins at a greater manufacturing cost and complexity. Accordingly, using two mated linear finned heatsinks 305f provides a less complex and less expensive solution compared with using extruded aluminum to provide a single closed channel heatsink. The large number of flow channels 207f increases the efficiency of removing heat from the processing units 205f to reduce the heat gradient between the chips 316f and the fluid at the outlet. The reduction in the heat gradient is obtained by providing a high flow velocity within the channels 207f and providing a large heatsink surface area without substantially extending the length of each fin.

Figure 12:
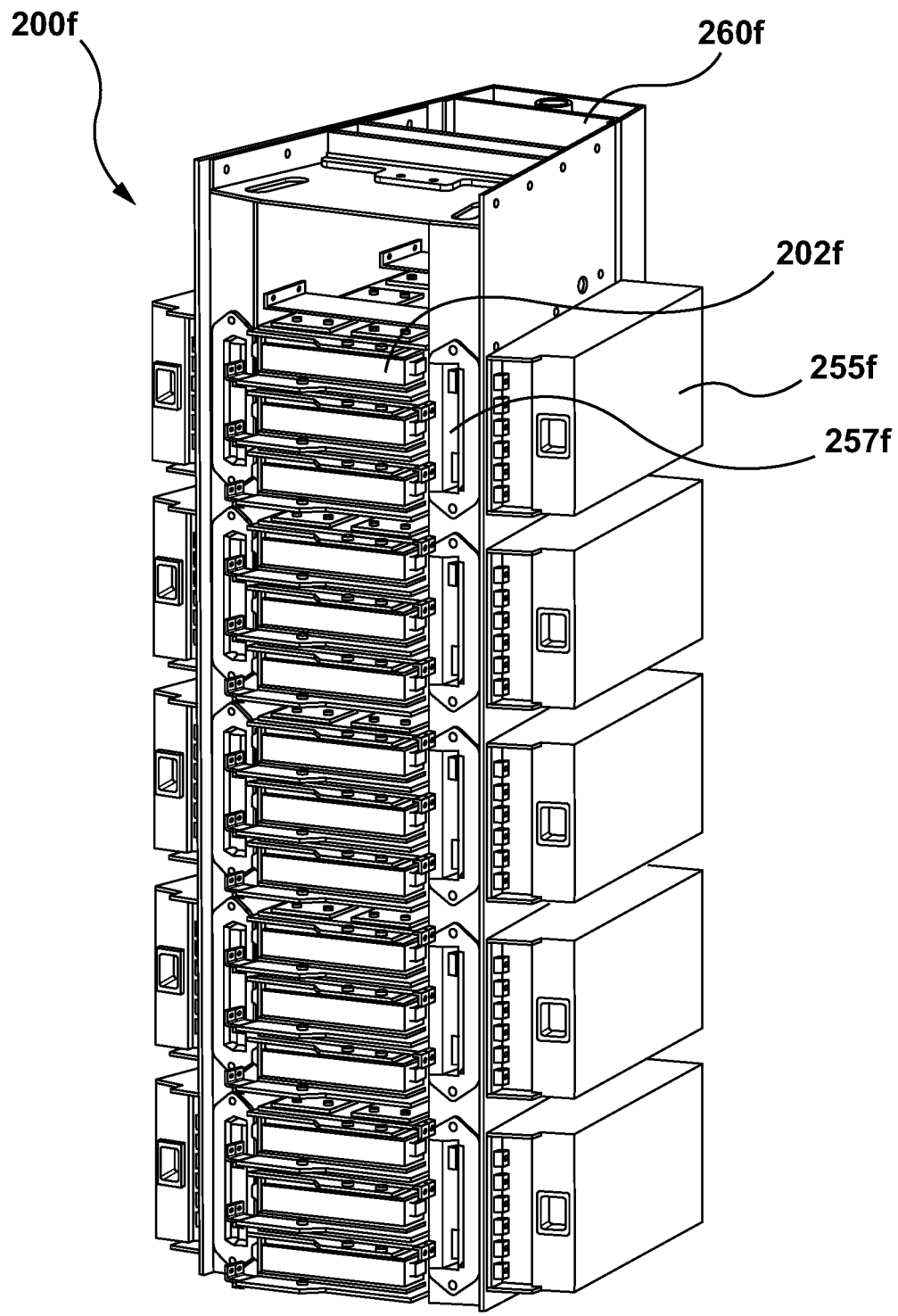
FIG. 12 is a perspective view of an example of a multi-stacked structure.

Referring to FIG. 12, it is to be appreciated that multiple substructures 202f may be disposed in a rack to form stacks or multi-stacked structures 200f. The components of the multi-stacked structure 200f are not limited and power supply units 255f and control boards 257f may be used to control one or more processing units 205f. In the present example, each power supply unit 255f provides power to a control board 257f, which controls three substructures 202f with a total of six processing units 205f to form a layer. The multi-stacked structure 200f of the present example includes five layers. Each multi-stacked structure 200f operates in a tank 110f immersed in non-conductive fluid. In operation, a suction is created proximate to the outlet plate 260f to draw fluid through the channels 207f of each substructure 202f. As discussed above, the outlet plate 260f seals against a manifold 250f to reduce leakage around the end of the channels 207f to draw more fluid through the channels 207f.

Figure 13:
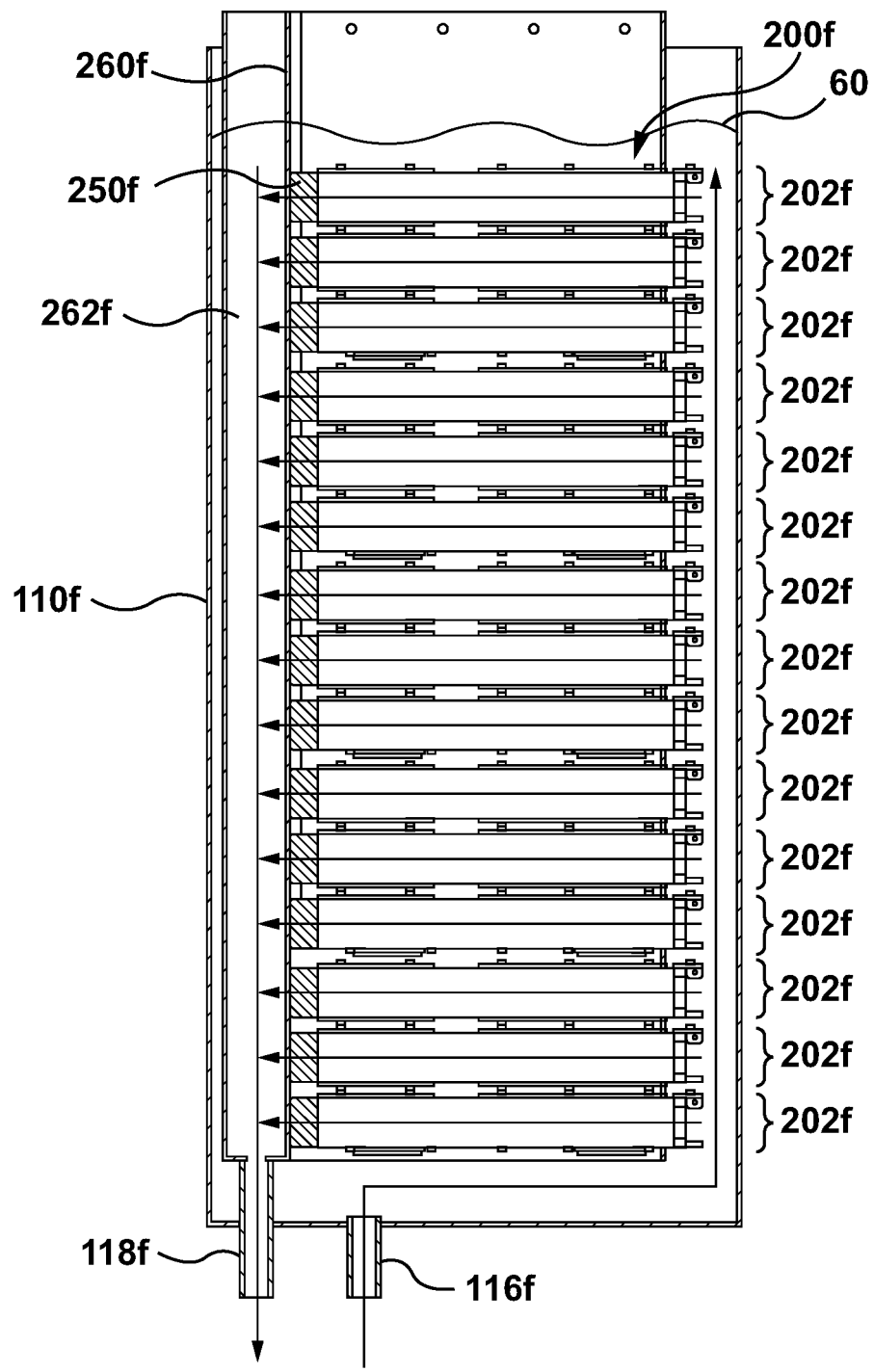
FIG. 13 is a cross sectional view of the multi-stacked structure of the system shown in FIG. 12.

Referring to FIG. 13, a cross section of a multi-stacked structure 200f in a tank 110f is shown. In the present example, the multi-stacked structure 200f is contained within the tank 110f. Fluid enters the tank 110f via an inlet pipe 116f, where the fluid is distributed within the volume of the tank 110f. The outlet pipe 118f is connected to the remainder of the fluid flow system (not shown) and provides a suction from a pump on the fluid in the tank 110f. In the present example, the outlet pipe 118f draws fluid from an outlet volume 262f which is separated from the main volume of the tank 110f. The manifold 250f of each substructure 202f seals against the outlet plate 260f, which has openings that correspond with the channels 207f of each substructure 202f. As fluid is drawn through the channels 207f of each substructure 202f, the heat generated by the mining chips 316f is transferred to the fluid. The heated fluid is drawn into the outlet volume 262f by a suction on the outlet volume 262f. The suction at the outlet volume 262f is not limited and may be provided by a pump (not shown) proximate to the outlet pipe 118f.

In the present example, the tank 110f is an atmospheric tank, which has the benefit of lighter construction specifications without sealing. When the fluid is cold it will minimally immerse the highest substructure 202f of the multi-stacked structure 200f, such as to the water level 60. The extra height of the tank 110f may accommodate for fluid expansion. In addition, by using an atmospheric tank, it allows the fluid loop to operate without an expansion tank to save on cost and complexity. It is to be appreciated by a person of skill with the benefit of this description that the tank 110f may be sealed and additional means for accommodating fluid expansion are disposed elsewhere in the fluid loop.

An atmospheric tank configuration may have further advantages, such as increasing the ease of assembly and/or maintenance. For example, during maintenance, the multi-stacked structure 200f may be lifted out of the tank 110f by an actuator or pulley lift. Once lifted above the tank 110f, maintenance may be done to the stack, without draining the fluid from the tank 110f.

Figure 14:
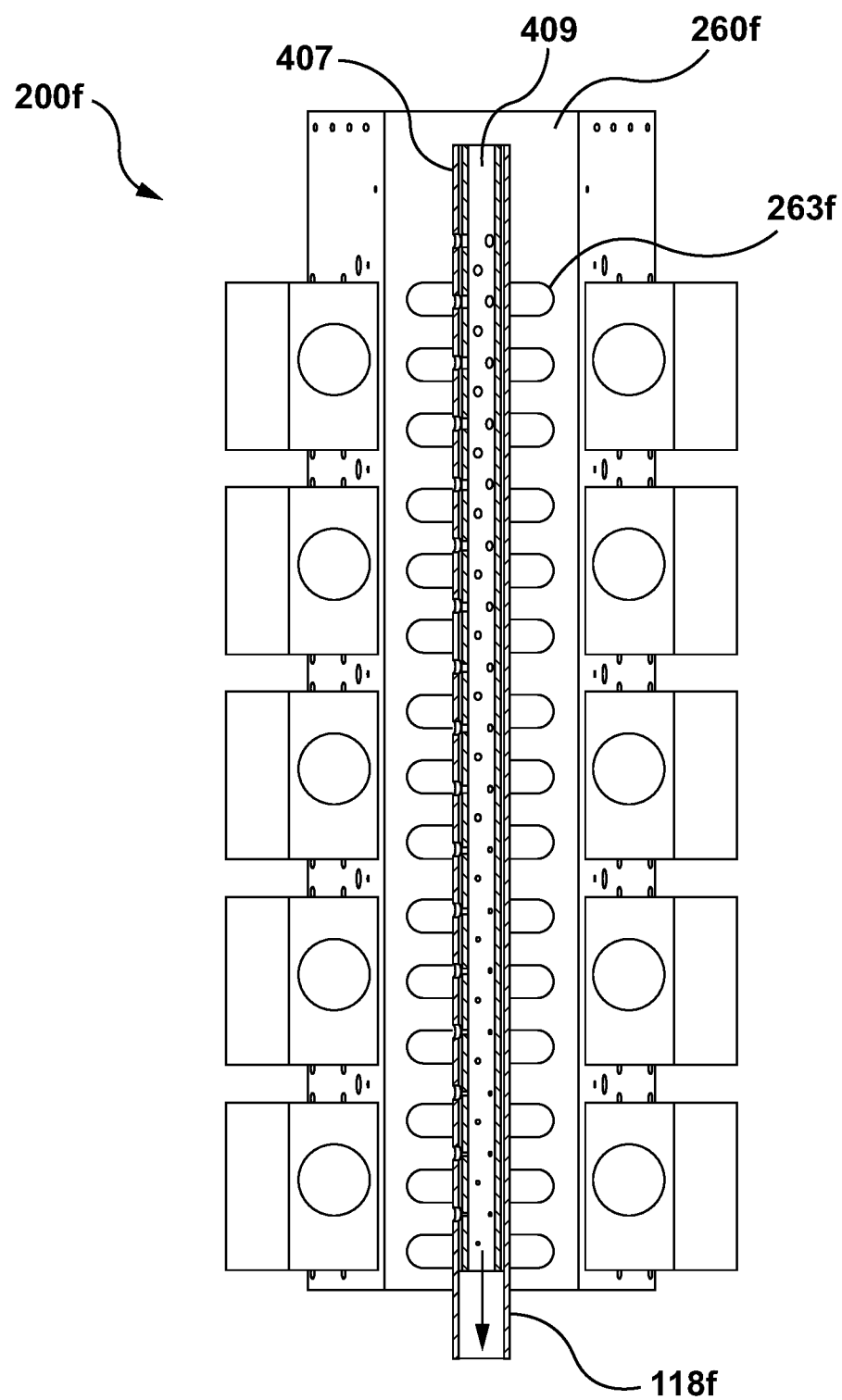
FIG. 14 is a back side view of an example of a multi-stacked structure.

Referring to FIG. 14, a view of the multi-stacked structure 200f from the outlet side is shown to illustrate a flow balancing mechanism to balance the flow rate across each substructure 202f. In the present example, concentric tubes 407 and 409 are connected to the outlet pipe 118f. The outer tube 407 includes larger perforations and is sealed against outlet pipe 118f. Accordingly, all fluid drawn by the suction at the outlet pipe 118f passes through the perforations of the outer tube 407. The inner tube 409 sits within the outer tube 407, and has perforations that line up with those of outer tube 407. The inner tube 409 is removable, with the diameter of its perforations being varied to balance flow between layers. For example, if the bottom layer receives too much flow, the inner tube 409 may be removed and replaced with a version that has smaller perforations near the opening 263f of the lower layer. It is to be appreciated by a person with the benefit of this description that in some examples, the outer tube 407 and the inner tube 409 may be replaced with a single tube with predetermined, fixed perforations sizes.

Figure 15:
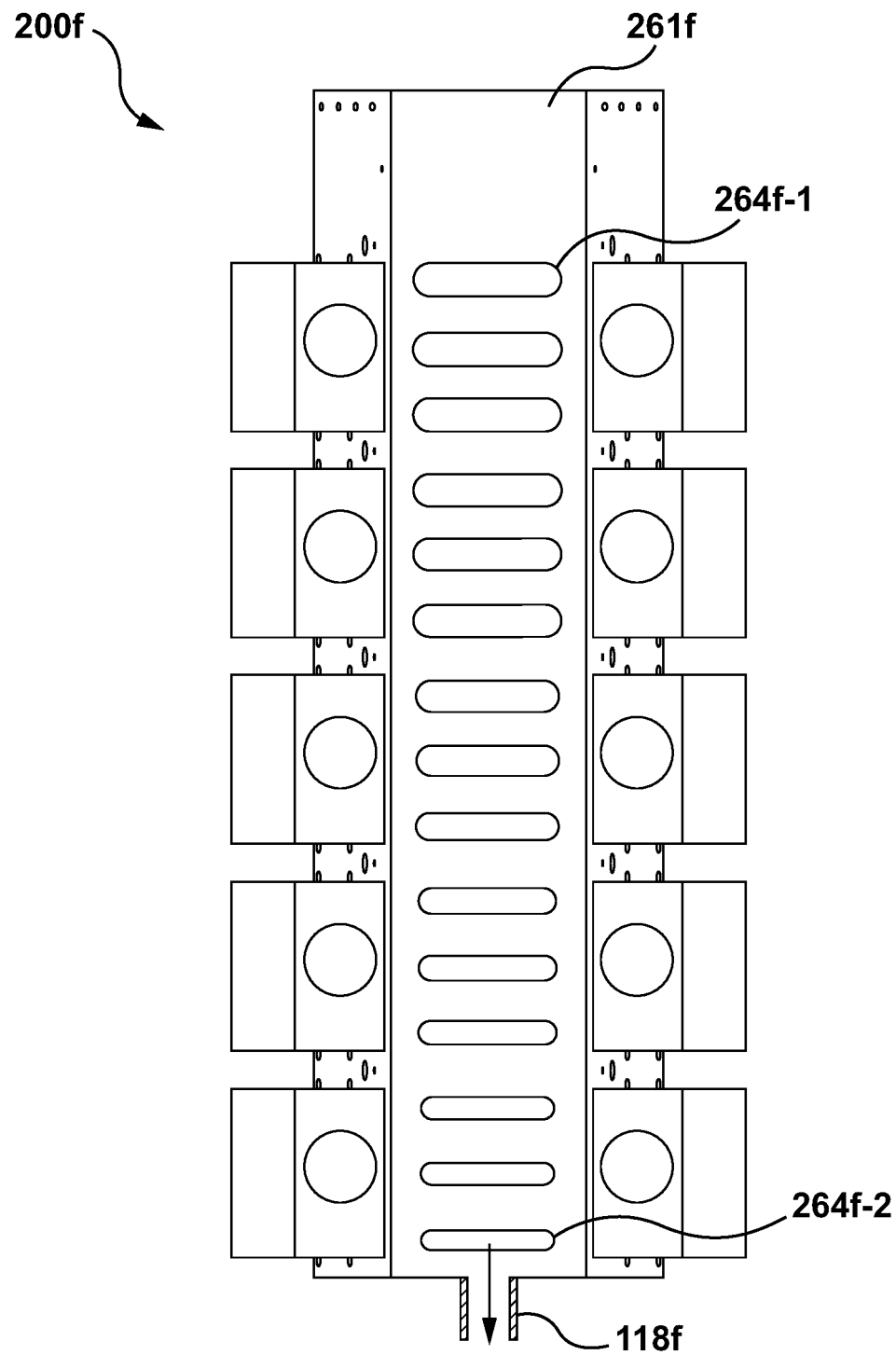
FIG. 15 is a back side view of another example of a multi-stacked structure.

Referring to FIG. 15, a view of the multi-stacked structure 200f from the outlet side is shown to illustrate another flow balancing mechanism to balance the flow rate across each substructure 202f. In the present example, the outlet plate 260f with uniform openings 263f is replaced with another outlet plate 261f with variable openings. The opening sizes are varied to balance the flow between each substructure 202f at operating conditions. For example, the opening 264f-1 at the top of the multi-stacked structure 200f may be wider than the opening 264f-2 for a substructure 202f at the bottom of the multi-stacked structure 200f.

Figure 16:
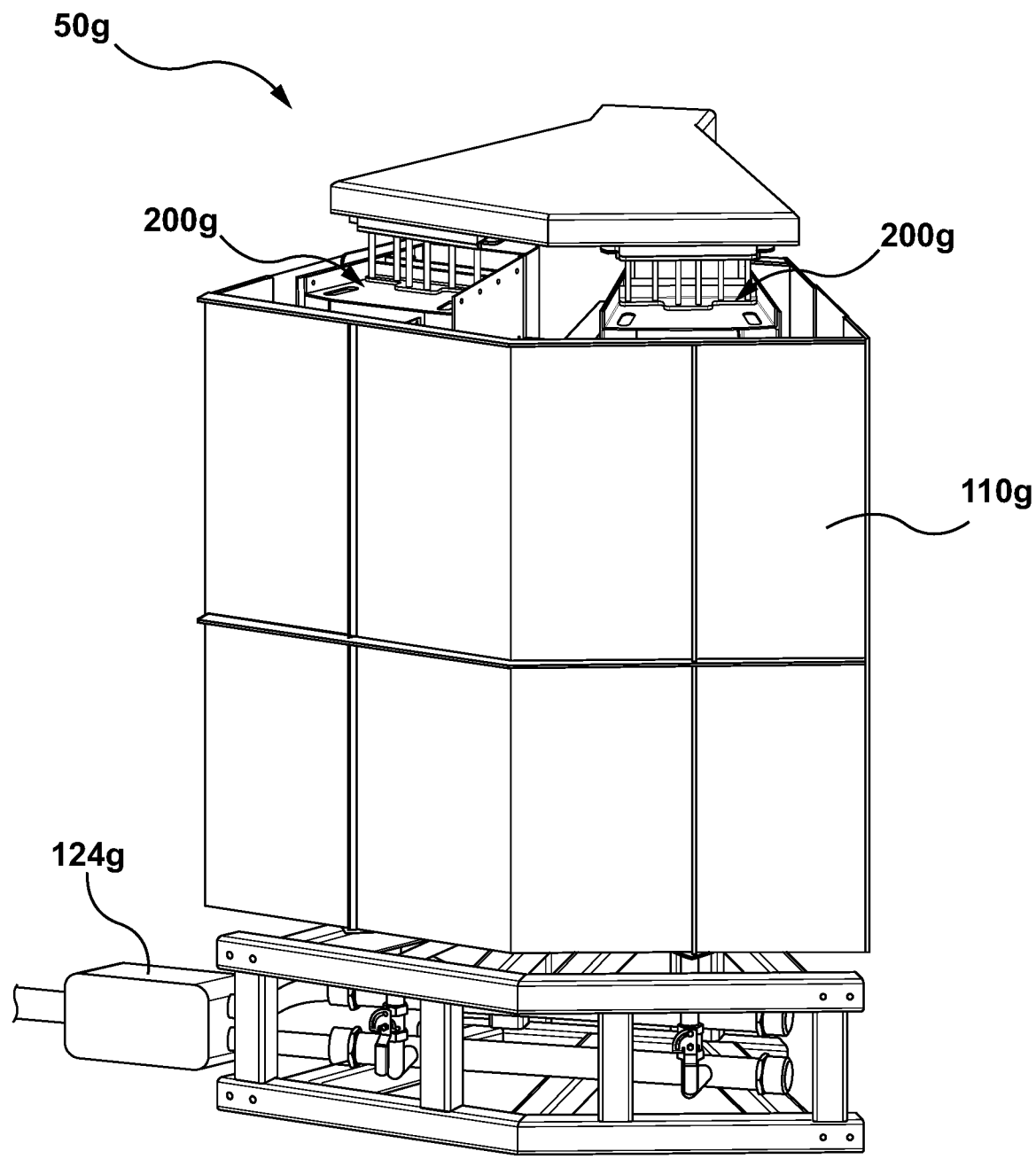
FIG. 16 is a perspective view of an example of an apparatus to recover heat from multiple layers of computer components.
Figure 17:
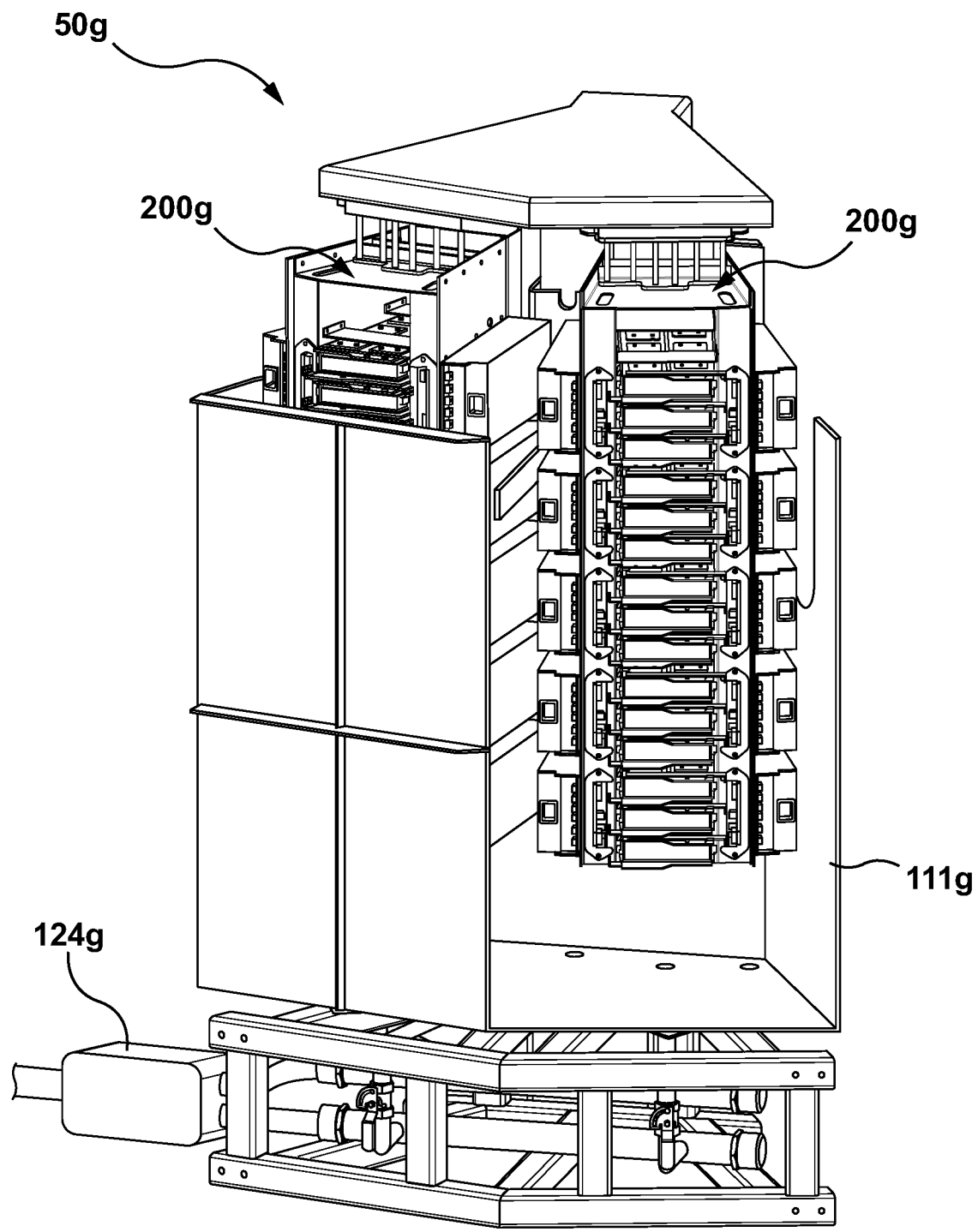
FIG. 17 is an exploded view of an example of an apparatus to recover heat from multiple layers of computer components.

Referring to FIGS. 16 and 17, an apparatus 50g to recover heat from a cryptocurrency mining operation is shown. The apparatus 50g includes a plurality of multi-stacked structures 200g, where each multi-stacked structure 200g is contained within a segment in a tank 110g. In the present example, the segment includes two multi-stacked structures 200g. Each segment is designed to function as its own unit, but may also be connected to additional segments in a modular fashion. When connected to another segment, the tank 110g may be modified by adding and removing panels 111g. In some examples, the panels 111g may allow fluid to pass through to an adjacent segment to balance the fluid level in the segments passively. It is to be appreciated by a person of skill with the benefit of this description that the fluid supplied to each segment is not finely balanced, and may vary slightly between the segments.

In the present example, each segment has a separate fluid inlet in the tank 110g, supplied by inlet pipes underneath the tank 110g. When segments are connected together their inlet pipes and outlet pipes are also connected together, creating a manifold from a single source that supplies fluid to each segment. Each segment has one outlet per housed stack, which connects to and seals against the outlet volume of each stack. A valve may be placed between each outlet before connecting to the outlet manifold formed by connected pipes to balance the outlet flow between each stack. It is to be appreciated that this valve may be manually or automatically controlled. Outlet flow from each stack may be measured directly with a flow sensor, or it may be measured indirectly by observing the fluid level of each outlet volume.

Figure 18:
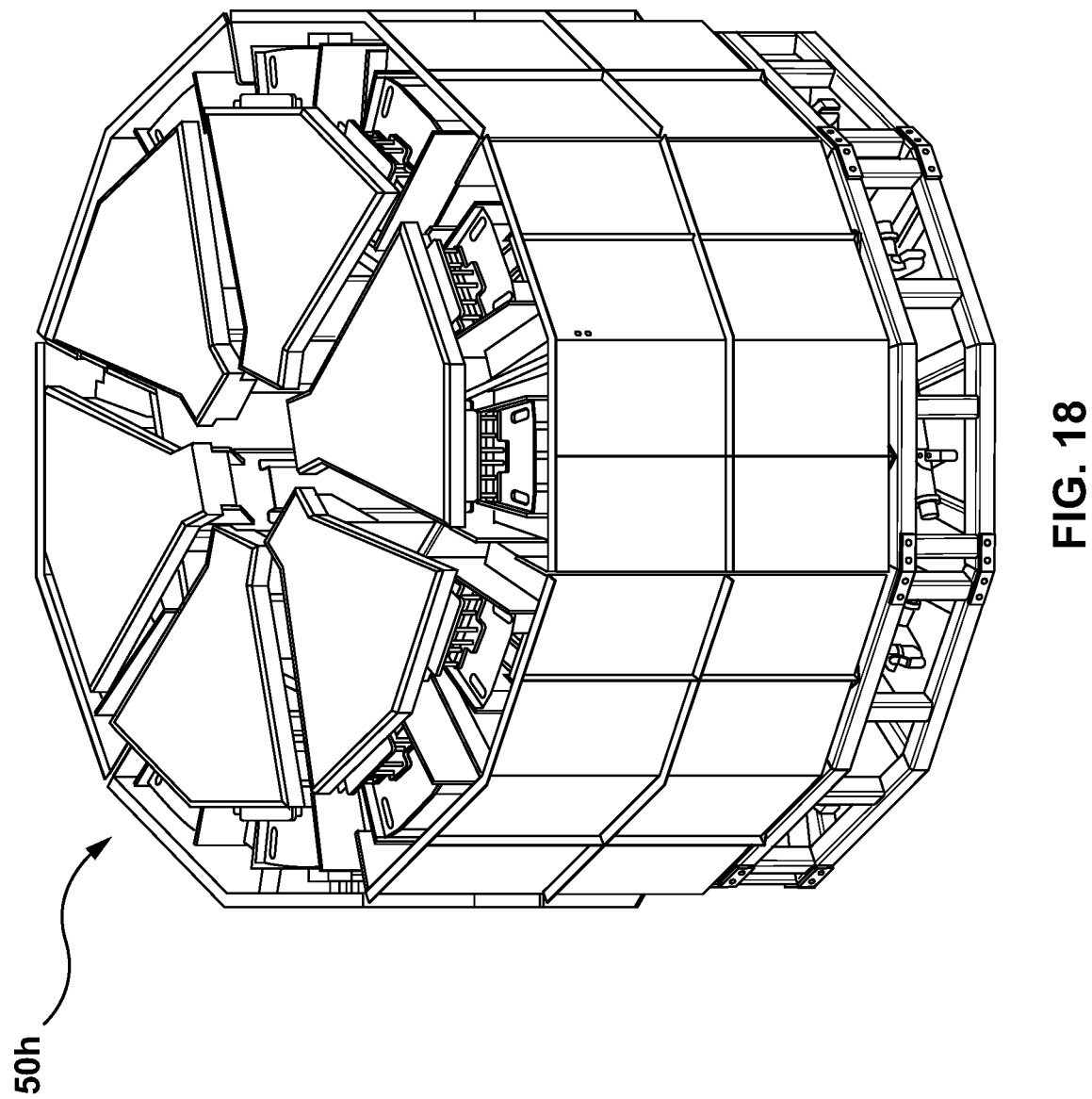
FIG. 18 is a perspective view of another example of an apparatus to recover heat from multiple layers of computer components.

Referring to FIG. 18, another apparatus 50h to recover heat from a cryptocurrency mining operation is shown. In the present example, multiple segments are connected together forming a larger apparatus 50h which may include several apparatuses 50g connected together. In the present example, the apparatus 50h is connected in a fluid loop, and is supplied with a single fluid inlet, and a single fluid outlet. The outlet pipe of each segment of the apparatus 50h are connected together to form a manifold that divides the single outlet and inlet flows amongst each segment. The apparatus 50h includes six apparatuses 50g connected and is substantially circular, which simplifies pipe/electrical connections. In addition, the shape of the apparatus 50h is more thermally efficient due to its radial symmetry. It is to be appreciated that the modular nature of the apparatus 50h may be modified to connect segments and may take on different forms that may be better for different applications, such as a 90 degree configuration for a corner installation, or a long linear installation for a narrow wall installation.

Figure 19:
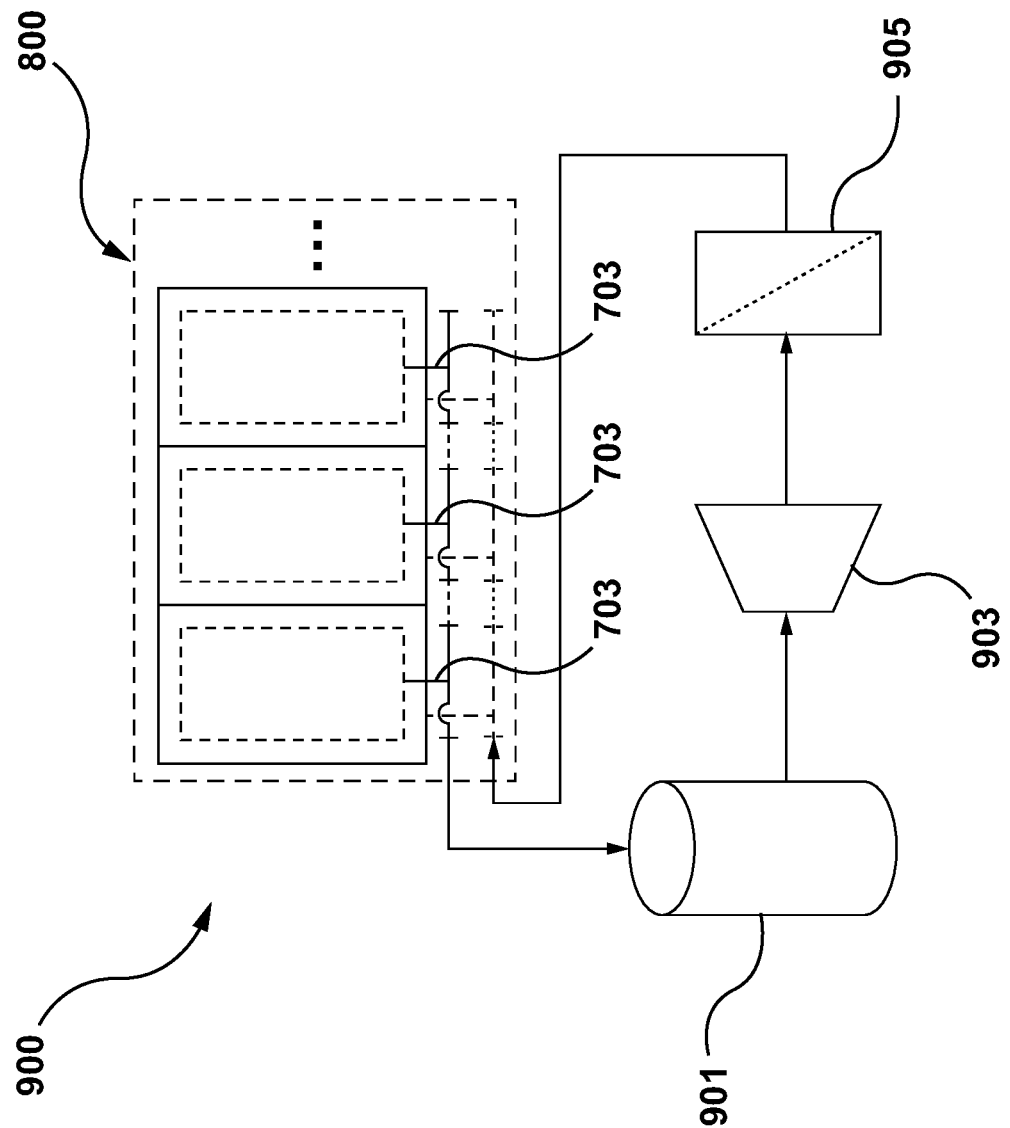
FIG. 19 is a schematic view of an example of a system to recover heat from multiple layers of computer components.

Referring to FIG. 19, a system diagram 900 shows a simplified fluid loop for a heat recovery system 800. Heated fluid exits the heat recovery system 800 via outlet pipes 703. It then passes to a buffer volume 901, which may provide means for accommodating fluid expansion (if non-atmospheric segments are used). It is then driven by pump 903 into the heat exchanger 905, where its heat energy is exchanged to another working fluid. In this application that fluid is water for a district energy heating system, but in other applications it may be some other fluid or air. After leaving the heat exchanger 905, the now cool fluid is driven into the heat recovery system 800 for heating.

It is to be appreciated by a person of skill with the benefit of this description that the order of elements in this fluid loop may be rearranged without affecting functionality. Additionally, elements may be removed (such as buffer volume 901), added (such as filters, strainers, etc.), or integrated in different ways.

Figure 20:
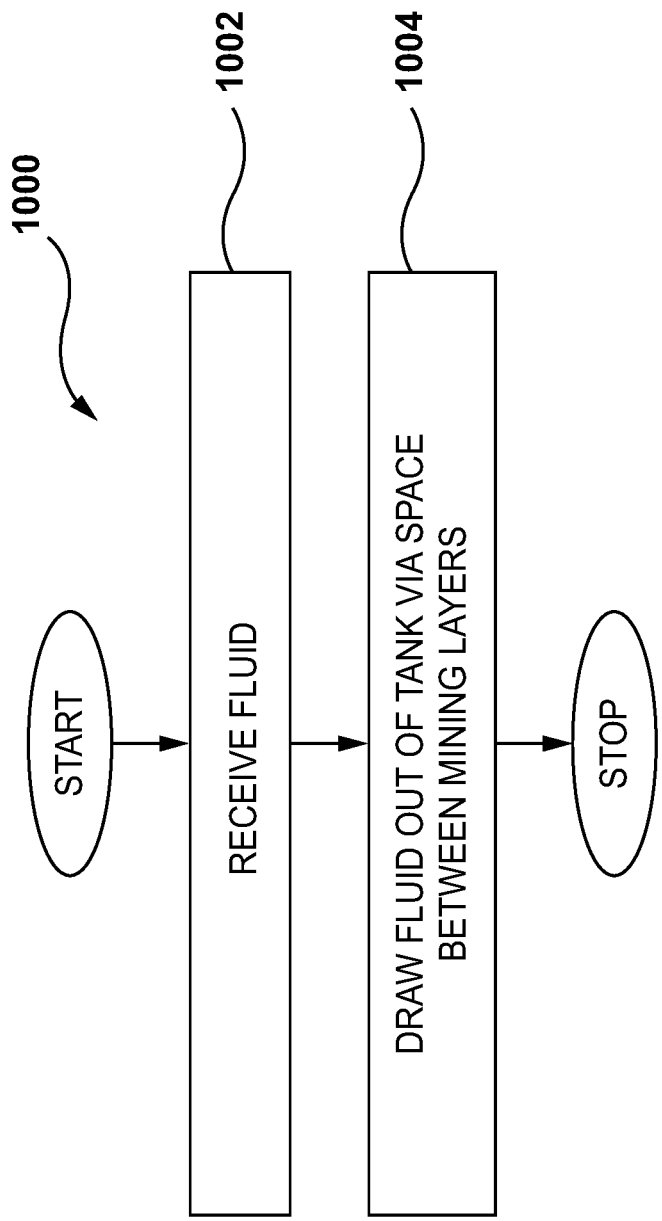
FIG. 20 is a flowchart of an example process of recovering heat from multiple layers of computer components.

Referring to FIG. 20, a flowchart of a method 1000 of recovering heat from a plurality of heat generating elements is generally shown. In order to assist in the explanation of method 1000, it will be assumed that method 1000 may be performed with the apparatus 50. Indeed, the method 1000 may be one way in which apparatus 50 may be configured. Furthermore, the following discussion of method 1000 may lead to a further understanding of the apparatus 50 and its various components as well as the system 100. In the following discussion, the term "block" is to be used and considered synonymous with the term "step" used above.

Block 1002 involves receiving fluid in a tank 110. In the present example, a pump is used to reduce the pressure at an outlet of the tank 110 and increase the pressure at the inlet to circulate the fluid through the system. Once the fluid is in the tank 110, the fluid is drawn out with a suction at the outlet at block 1004. In the present example, the suction draws the fluid through the space between mining layers at a higher velocity to improve the efficiency of cooling the mining layers.

It should be recognized that features and aspects of the various examples provided above may be combined into further examples that also fall within the scope of the present disclosure.

What is claimed is:

1. An apparatus comprising:
   a tank to store a fluid;
   a first mining layer disposed in the tank;
   a first heatsink thermally coupled to the first mining layer to dissipate heat from the first mining layer;
   a second mining layer disposed in the tank proximate to the first mining layer, wherein the first mining layer and the second mining layer are substantially parallel;
   a second heatsink thermally coupled to the second mining layer to dissipate heat from the second mining layer;
   an outlet plate disposed in the tank;

an outlet disposed on the tank to release the fluid; and a pump to generate a suction to draw the fluid out of the tank via the outlet, wherein the suction creates a fluid flow in a space between the first mining layer and the second mining layer;

wherein the first heatsink and the second heatsink are disposed within the space between the first mining layer and the second mining layer, wherein the first heatsink includes a first plurality of fins and the second heatsink includes a second plurality of fins, wherein the first plurality of fins and the a second plurality of fins mate to form a plurality of channels within the space, and wherein a first end of the plurality of channels is mounted to the outlet plate, and wherein the plurality of channels is to align with an opening of the outlet plate to enhance fluid flow through the plurality of channels.

2. The apparatus of claim 1, further comprising an inlet disposed on the tank to receive the fluid to replace the fluid released from the outlet.

3. The apparatus of claim 1, wherein the tank is open to atmosphere to accommodate volume changes of the fluid due to temperature changes.

4. A system comprising:

an apparatus to receive a fluid to collect heat from a plurality of mining layers, the apparatus comprising:

a tank;

a first mining layer disposed in the tank;

a first heatsink thermally coupled to the first mining layer to dissipate heat from the first mining layer;

a second mining layer disposed in the tank proximate to the first mining layer, wherein the first mining layer and the second mining layer are substantially parallel; and a second heatsink thermally coupled to the second mining layer to dissipate heat from the second mining layer, wherein the first heatsink and the second heatsink are disposed within the space between the first mining layer and the second mining layer;

an outlet plate; and a pump to generate a suction to draw the fluid out of the tank via an outlet, wherein the suction creates a fluid flow in a space between the first mining layer and the second mining layer;

wherein the first heatsink includes a first plurality of fins and the second heatsink includes a second plurality of fins, wherein the first plurality of fins and the a second plurality of fins mate to form a plurality of channels within the space, and wherein a first end of the plurality of channels is mounted to the outlet plate, and wherein the plurality of channels is to align with an opening of the outlet plate to enhance fluid flow through the plurality of channels;

a heat exchanger to remove heat from the fluid; and a fluid transport system to provide a fluidic connection between the tank, the pump, and the heat exchanger, wherein the pump is to move the fluid between the tank, the pump, and the heat exchanger.

5. The system of claim 4, wherein the apparatus includes an inlet disposed on the tank to receive the fluid to replace the fluid released from the outlet.

6. The system of claim 4, wherein the tank is open to atmosphere to accommodate volume changes of the fluid due to temperature changes.

7. A method comprising receiving fluid in a tank;

drawing the fluid out of the tank via an outlet, wherein drawing the fluid out comprises drawing the fluid through a space between a first mining layer and a second mining layer, wherein the first mining layer is disposed in the tank, wherein the second mining layer is disposed in the tank proximate to the first mining layer, and wherein the first mining layer and the second mining layer are substantially parallel dissipating heat from the first mining layer via a first heatsink thermally coupled to the first mining layer;

dissipating heat from the second mining layer via a second heatsink thermally coupled to the second mining layer, wherein the first heatsink and the second heatsink are disposed within the space between the first mining layer and the second mining layer;

mating a first plurality of fins of the first heatsink and a second plurality of fins of the second heatsink to form a plurality of channels within the space; and enhancing fluid flow through the plurality of channels with an outlet plate, wherein a first end of the plurality of channels is mounted to the outlet plate, and wherein the plurality of channels is to align with an opening of the outlet plate to force fluid flow through the plurality of channels.

8. The method of claim 7, wherein drawing the fluid out of the tank comprises drawing the fluid through a channel formed between the first mining layer and the second mining layer.

\* \* \* \* \*